United States Patent
Bayerer et al.

(10) Patent No.: US 8,018,047 B2
(45) Date of Patent: Sep. 13, 2011

(54) POWER SEMICONDUCTOR MODULE INCLUDING A MULTILAYER SUBSTRATE

(75) Inventors: Reinhold Bayerer, Warstein (DE); Thomas Hunger, Moehnesee (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/624,622

(22) Filed: Nov. 24, 2009

(65) Prior Publication Data
US 2010/0065962 A1 Mar. 18, 2010

Related U.S. Application Data

(63) Continuation-in-part of application No. 11/834,395, filed on Aug. 6, 2007.

(51) Int. Cl.
*H01L 23/053* (2006.01)
*H01L 23/12* (2006.01)
*H01L 23/48* (2006.01)
*H01L 23/52* (2006.01)
*H01L 29/40* (2006.01)

(52) U.S. Cl. .............. 257/700; 257/758; 257/E23.009; 257/E23.019; 257/E23.062

(58) Field of Classification Search .............. 257/700, 257/758, E23.009, E23.019, E23.062
See application file for complete search history.

(56) References Cited

U.S. PATENT DOCUMENTS

| | | | | |
|---|---|---|---|---|
| 4,766,481 A | | 8/1988 | Gobrecht et al. | |
| 5,075,665 A | * | 12/1991 | Taira et al. | 338/21 |
| 5,597,494 A | * | 1/1997 | Kohno et al. | 216/6 |
| 5,625,225 A | * | 4/1997 | Huang et al. | 257/700 |
| 5,792,677 A | * | 8/1998 | Reddy et al. | 438/122 |
| 5,804,870 A | * | 9/1998 | Burns | 257/666 |
| 5,811,878 A | * | 9/1998 | Harmoinen et al. | 257/723 |
| 6,201,701 B1 | | 3/2001 | Linden et al. | |
| 6,310,401 B1 | * | 10/2001 | Stoisiek et al. | 257/782 |
| 6,426,551 B1 | * | 7/2002 | Kawakami et al. | 257/700 |
| 6,605,868 B2 | * | 8/2003 | Ishiwata et al. | 257/703 |
| 6,608,376 B1 | * | 8/2003 | Liew et al. | 257/698 |
| 6,613,450 B2 | * | 9/2003 | Tsukaguchi et al. | 428/621 |
| 6,704,191 B2 | * | 3/2004 | Hattori | 361/321.3 |
| 6,800,936 B2 | * | 10/2004 | Kosemura et al. | 257/748 |
| 6,867,484 B2 | | 3/2005 | Nakajima et al. | |

(Continued)

FOREIGN PATENT DOCUMENTS

DE 3937045 A1 5/1991

(Continued)

OTHER PUBLICATIONS

"Leistungshalbleitermodule in Direkt-Bonding-Technik", Reinhold Bayerer, et al., Technische Rundschau 32/1988 with English Summary.

(Continued)

*Primary Examiner* — Ida M Soward
(74) *Attorney, Agent, or Firm* — Dicke, Billig & Czaja, PLLC

(57) ABSTRACT

A semiconductor module includes a multilayer substrate. The multilayer substrate includes a first metal layer and a first ceramic layer over the first metal layer. An edge of the first ceramic layer extends beyond an edge of the first metal layer. The multilayer substrate includes a second metal layer over the first ceramic layer and a second ceramic layer over the second metal layer. An edge of the second ceramic layer extends beyond an edge of the second metal layer. The multilayer substrate includes a third metal layer over the second ceramic layer.

22 Claims, 22 Drawing Sheets

U.S. PATENT DOCUMENTS

| | | | |
|---|---|---|---|
| 7,160,827 B2 * | 1/2007 | Banno | 501/138 |
| 7,221,048 B2 * | 5/2007 | Daeche et al. | 257/690 |
| 7,265,982 B2 * | 9/2007 | Inoue | 361/718 |
| 7,321,166 B2 * | 1/2008 | Sakai et al. | 257/700 |
| 7,372,132 B2 * | 5/2008 | Suzuki et al. | 257/676 |
| 7,649,252 B2 * | 1/2010 | Sakai et al. | 257/700 |
| 7,650,694 B2 * | 1/2010 | Mobley | 29/846 |
| 7,705,423 B2 * | 4/2010 | Swaminathan et al. | 257/532 |
| 2003/0150641 A1 * | 8/2003 | Kinayman et al. | 174/255 |
| 2003/0168729 A1 | 9/2003 | Ishiwata et al. | |
| 2004/0071946 A1 * | 4/2004 | Honda et al. | 428/209 |
| 2004/0099948 A1 | 5/2004 | Stockmeier | |
| 2005/0186768 A1 * | 8/2005 | Sugaya et al. | 438/597 |
| 2006/0097906 A1 * | 5/2006 | Heide | 342/22 |
| 2006/0109632 A1 | 5/2006 | Berlin et al. | |
| 2007/0007280 A1 | 1/2007 | Bayerer | |
| 2007/0123413 A1 * | 5/2007 | Suzuki | 501/138 |
| 2007/0224534 A1 * | 9/2007 | Kanbara et al. | 430/198 |
| 2008/0093117 A1 * | 4/2008 | Oikawa et al. | 174/262 |
| 2008/0261005 A1 * | 10/2008 | Nomiya et al. | 428/210 |
| 2008/0277761 A1 * | 11/2008 | Mahalingam et al. | 257/532 |
| 2009/0039498 A1 | 2/2009 | Bayerer | |

FOREIGN PATENT DOCUMENTS

| | | |
|---|---|---|
| DE | 19615481 A1 | 10/1997 |
| JP | 2002076214 A | 3/2002 |
| JP | 2003086747 A | 3/2003 |

OTHER PUBLICATIONS

U.S. Appl. No. 11/834,395 Office Action mailed Mar. 24, 2011 (26 pgs).

* cited by examiner

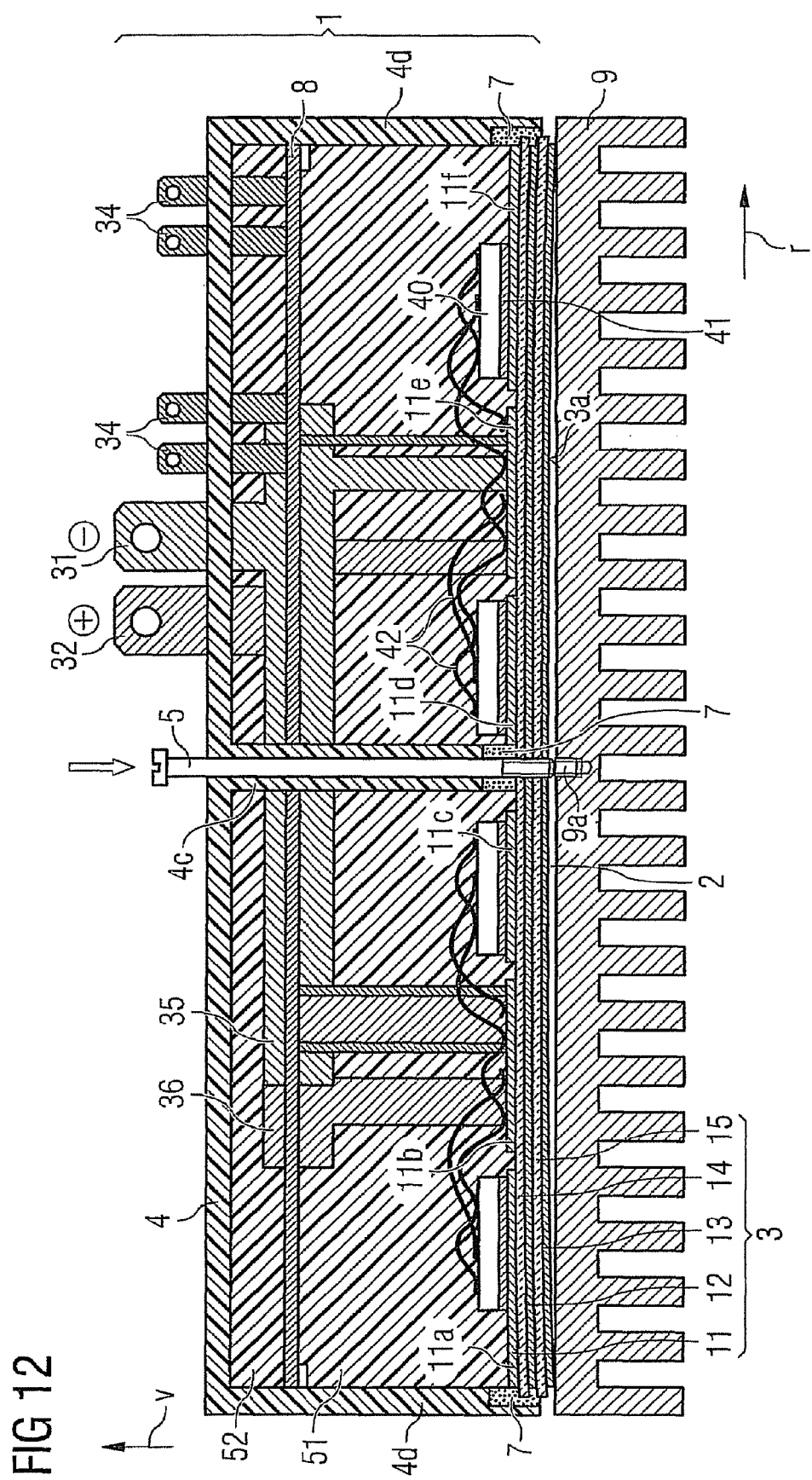

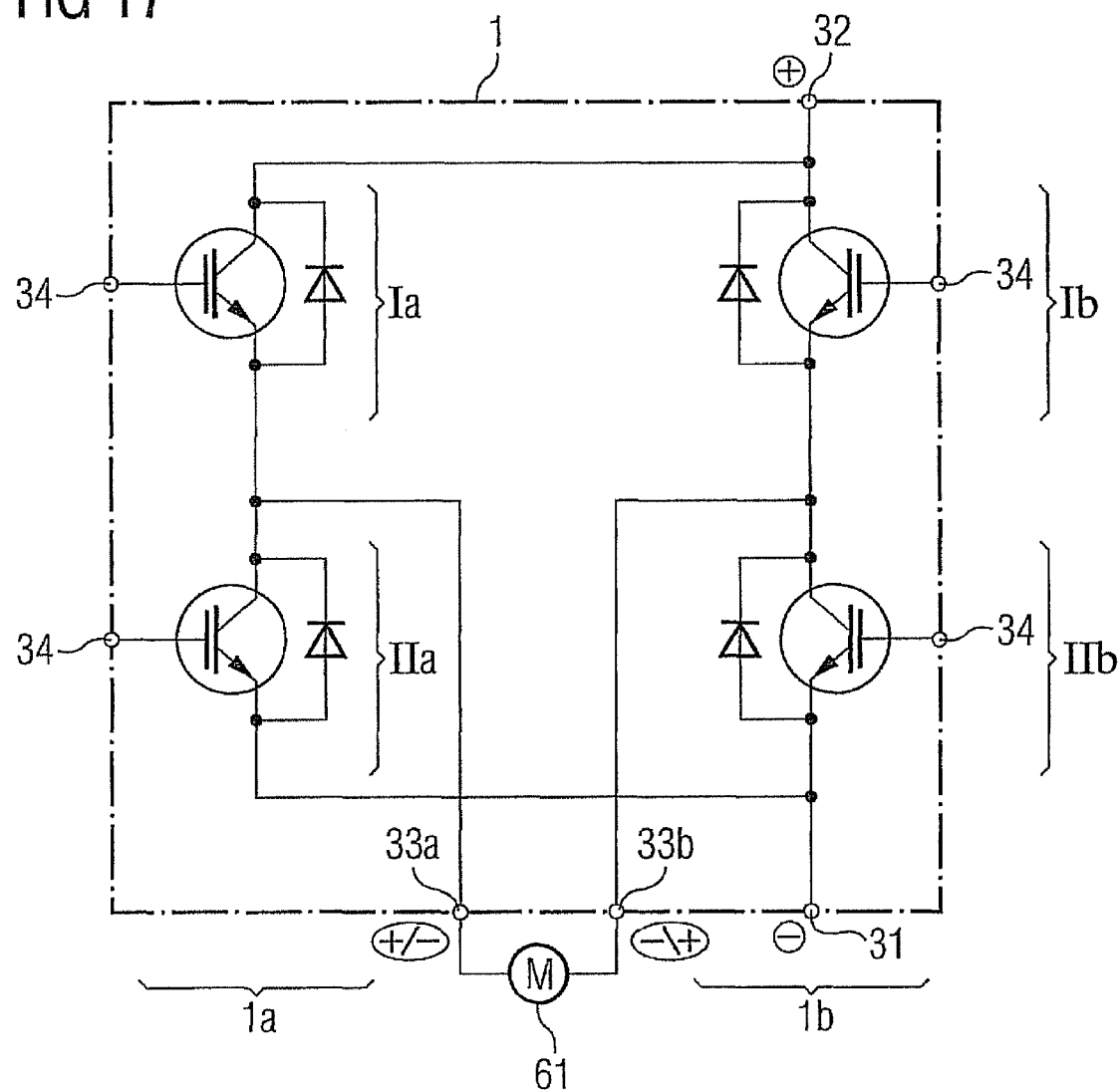

US 8,018,047 B2

POWER SEMICONDUCTOR MODULE INCLUDING A MULTILAYER SUBSTRATE

CROSS REFERENCE TO RELATED APPLICATIONS

This application is a continuation-in-part of U.S. patent application Ser. No. 11/834,395, filed Aug. 6, 2007, and entitled "Power Semiconductor Module," which is incorporated herein by reference.

BACKGROUND

The invention relates to power semiconductor modules.

Conventional power semiconductor modules include one or more power semiconductor chips which are arranged on a plane ceramic substrate which includes a metallization on at least one side. At least one of such ceramic substrates is soldered to a metallic base plate of the module. To improve cooling, the base plate may be pressed against a heat sink.

The metallized ceramic substrates are pressed against the heat sink without a metallic base plate in between. To reduce the heat transmission resistance between the substrate and the heat sink, a layer of heat conductive paste is required. As the thermal conductivity of such a heat conductive paste is limited, the thickness of the layer of heat conductive paste needs to be very thin. However, apart from the locations to which downforce is applied to the substrates, the substrates tend to bend upwards, i.e. away from the heat sink. The result is a non-uniform thickness of the heat conductive paste.

To avoid this, the downforce is sought to be uniformly distributed over the substrate. For this, mechanical structures are provided to apply pressure onto the substrate all over the substrate area. However, due to the presence of semiconductor chips, bonding wires etc., the options to apply pressure all over the substrate area are limited.

In addition, on the top side of the metallized ceramic substrate, the metal layer is structured according to the power circuit requirements and the power semiconductor chips are arranged on the structured metal layer. For high electrical isolation (e.g., semiconductor blocking voltages $\geq 1700$V) from the power circuit to the base plate, the rectangular cross section of the conductors and the sharp shape of the conductors at the edges and corners of the substrate provide an electric field that is inhomogeneous and significantly increased. Due to the sharp rectangular edge geometry, the electric field cannot be reduced significantly by a thicker ceramic layer. Power semiconductor modules for high voltage isolation have to pass an isolation voltage test (e.g., high pot test) of more than 4 kVrms and have to be free of partial discharges when applying voltages at and above 2 kVrms. For example, a 6.5 kV-IGBT-module has to pass a 10 kVrms isolation voltage test and has to be free of partial discharges at 5.2 kVrms.

For these and other reasons, there is a need for the present invention.

SUMMARY

One embodiment provides a semiconductor module including a multilayer substrate. The multilayer substrate includes a first metal layer and a first ceramic layer over the first metal layer. An edge of the first ceramic layer extends beyond an edge of the first metal layer. The multilayer substrate includes a second metal layer over the first ceramic layer and a second ceramic layer over the second metal layer. An edge of the second ceramic layer extends beyond an edge of the second metal layer. The multilayer substrate includes a third metal layer over the second ceramic layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 12 illustrates a vertical cross sectional view of an equipped multilayer substrate being pressed against a heat sink and formed concave relative to the center of the power semiconductor module.

FIG. 17 illustrates a circuit diagram of power semiconductor module including a H-Bridge.

DETAILED DESCRIPTION

Figure 1:
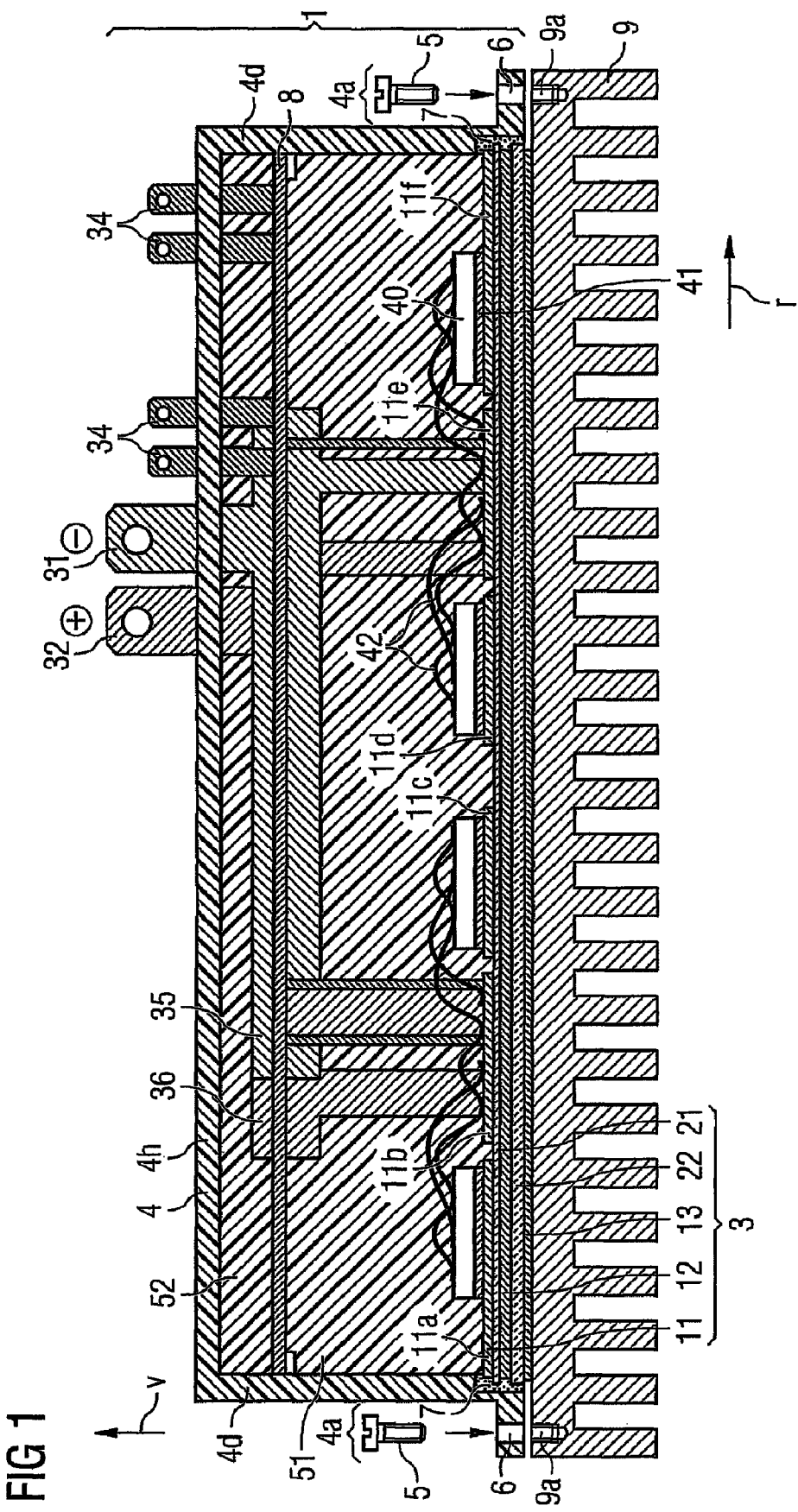
FIG. 1 illustrates a vertical cross sectional view of an arrangement with a power semiconductor module including a single multilayer substrate as base plate with three metal layers and two ceramic layers which is pressed with the multilayer substrate against a heat sink.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide a power semiconductor module with a multilayer substrate. In one embodiment, the multilayer substrate includes a group of metal layers with at least a first metal layer, a second metal layer and a third metal layer, and a group of ceramic layers with at least a first ceramic layer and a second ceramic layer. The layers of the group of metal layers and the layers of the group of ceramic layers are arranged successively in a vertical direction such that the first ceramic layer is arranged between the first metal layer and the second metal layer and that the second ceramic layer is arranged between the second metal layer and the third metal layer. The third metal layer forms the bottom layer of the multilayer substrate. The second ceramic layer includes a top surface facing away from the third metal layer. An electric power circuit of the module includes at least one power semiconductor chip. A housing cover of the module includes a side wall including a bottom surface facing towards the multilayer substrate. Between the bottom surface of the side wall and the top surface of the second ceramic layer an elastic filler is arranged at least partly.

Another embodiment provides a power semiconductor arrangement including such power semiconductor module and a heat sink. The power semiconductor module is pressed against the heat sink with the multilayer substrate ahead.

Another embodiment provides a multilayer substrate for a power semiconductor module. The multilayer substrate includes a group of metal layers with at least a first metal layer, a second metal layer and a third metal layer, and a group of ceramic layers with at least a first ceramic layer and a second ceramic layer. The layers of the group of metal layers and the layers of the group of ceramic layers are arranged successively in a vertical direction such that the first ceramic layer is arranged between the first metal layer and the second metal layer and that the second ceramic layer is arranged between the second metal layer and the third metal layer. The thickness of the first metal layer and the thickness of the third metal layer is less than or equal to 2 mm. The third metal layer forms an outer surface layer of multilayer substrate.

Another embodiment provides a multilayer substrate for a power semiconductor module. In one embodiment, the power semiconductor module includes a base plate. In another embodiment, the power semiconductor module does not include a base plate. In either embodiment, the multilayer substrate divides the isolation voltage and the electric field between two or more layers. The edge geometry, the ceramic thicknesses, and the metal layer thicknesses of the multilayer substrate are optimized to provide an optimized spread of the isolation voltage and the electric field over the layers at the edges and corners of the substrate.

FIG. 1 is a vertical cross sectional view of an arrangement with power semiconductor module 1 which includes a single base plate which is formed as multilayer substrate 3. The power semiconductor module 1 configured is to be pressed against a heat sink 9 using screws 5. After inserting the screws 5 into mounting holes 6 the screws 5 are screwed in internal threads 9a of the heat sink 9 and the power semiconductor module 1 is detachable connected with the heat sink 9. The downforce generated by the screws 5 affects mounting areas 4a of a housing cover 4 of the semiconductor module 1. Thus, the multilayer substrate 3 is pressed against the heat sink 9 by the lower parts of the side walls 4d of the housing cover 4. Whereas conventional power semiconductor modules require a base plate to which the module is mounted before the module is pressed against a heat sink, in the power semiconductor module 1 according to the present invention such an additional base plate is dispensable, i.e. the power semiconductor module 1 may be pressed directly against a heat sink 9 with the multilayer substrate 3 ahead. Optionally, a heat conductive paste may be arranged between the multilayer substrate 3 and the heat sink 9. Instead of or in addition to screws 5 any other mechanism may be applied to directly or indirectly press the multilayer substrate 3 against the heat sink 9.

The multilayer substrate 3 includes three metal layers 11, 12, 13 and two ceramic layers 21, 22 which are arranged in succession and alternately in a vertical direction v. Between any two of the metal layers 11, 12, 13 at least one of the ceramic layers 21, 22 is arranged.

Metal layer 11 is the top layer of the multilayer substrate 3, i.e. the layer facing to the inner area of the module 1, and structured into sections 11a, 11b, 11c, 11d, 11e, 11f. The sections 11a-11f may form conductive lines and/or conductive areas. To the sections 11a, 11c, 11d, 11f power semiconductor chips 40 are directly joint and/or electrically connected by use of a bonding layer 41, e.g., a soft solder, a conductive adhesive, or a silver including layer which is the result of a low temperature joining technique (LTJT). The power semiconductor chips may be, for example, a controllable power semiconductor such as, e.g., MOSFETs, IGBTs, Thyristors, or power diodes. The upper sides of the power semiconductor chips 40 are connected to one another or to sections 11b, 11e of the top metallization 11 by bonding wires 42. The bonding wires 42 may be, e.g., wires made of aluminum or of an aluminum alloy, e.g., an aluminum-magnesium alloy, or wires made of copper or a copper alloy. The bonding may be done, e.g., by ultrasonic bonding. Instead of bonding wires 42 metal clips may be provided which are joined by a low temperature joining technique (LTJT).

Power semiconductor chips are semiconductor chips with high and/or high voltage ratings. For example, the current ratings may be greater than 50 A or greater than 75 A, the voltage ratings more than, e.g., 500 V. Moreover, the power semiconductor chips may include chip sizes of more than 5.5 mm×5.5 mm, or of more than 7 mm×7 mm.

To externally connect the power semiconductor module 1 to, e.g., a power supply, a load, a control unit, etc., terminals 31, 32 and 34 are provided. The terminals 31, 32 may, e.g., be formed as power supply terminals and be electrically connected and/or mechanically joined to the sections 11a, 11b, 11c, 11d, 11e, 11f. The terminals 34 may be, e.g., control terminals for controllable ones of the power semiconductor chips 40, or output terminals to provide information regarding the status of the module 1.

Above the power semiconductor chips 40 an optional printed circuit board (PCB) 8 for interconnecting internal driving terminals is provided. The printed circuit board 8 may also be equipped with control electronics for controlling the controllable ones of the power semiconductor chips 40. Power semiconductor modules including control electronics are also referred to as intelligent power modules (IPM).

The lower part of the power semiconductor module 1 is potted with an optional soft potting 51, e.g., silicone gel. The soft potting 51 may extend in the vertical direction v from the multilayer substrate 3 at least beyond the bonding wires 42, e.g., to the printed circuit board 8. Above the soft potting 51 an optional hard potting 52, e.g., of epoxy, is arranged to electrically insulate and mechanically stabilize the terminals 31, 32 and 34 and the printed circuit board 8. Alternatively, instead of hard potting 52 a soft potting, e.g., silicone, may be provided. Furthermore, the whole power semiconductor module 1 may be free of any hard potting, e.g., epoxy.

Terminals are mounted directly on the multilayer substrate 3. The module may include terminals which are incorporated in a plastic frame, e.g., in the housing cover or in a housing cover, and be bonded by wires or ribbons etc. to the multilayer substrate 3 or a device, e.g., a semiconductor chip 40 mounted thereon, and/or to the printed circuit board 8 or a device, e.g., a control circuit, mounted thereon.

Along the outer edges of the multilayer substrate 3, an optional filler 7 is provided for cushioning the down force effecting the multilayer substrate 3. Instead of a filler 7 different from soft potting 51 the filler 7 may be a part of the soft potting 51. Such cushioning is important as modern power semiconductor modules 1 may include a large number of power semiconductor chips 40 which requires a multilayer substrate 3 including a large area, e.g., of greater than 6 cm×8 cm. For example, the power semiconductor chips 40 may be arranged in more than 2 rows and more than 2 columns, i.e. the number of power semiconductor chips 40 mounted to the multilayer substrate 3 may be more than or equal to 9, or, e.g., more than or equal to 24, or more than or equal to 36.

In one embodiment, filler 7 may be used to electrically insulate at least some of the metal layers 11, 12, 13 from one another. Aside from that, the filler 7 distributes the down pressure from the side wall 4d of the housing cover 4 affecting the multilayer substrate 3 when the semiconductor module 1 is pressed against the heat sink 9 with the multilayer substrate 3 ahead. The filler 7 may include a hardness shore A of less than 85, or less than 65. To ensure a required rigidity, hardness shore A of filler 7 may be greater than, e.g., 20, or greater than 40.

If the housing cover 4 of the power semiconductor module 1 is pressed against a heat sink with the multilayer substrate 3 ahead, filler 7 will be compressed, i.e. filler 7 causes a cushioning effect. The effective length d7 of filler 7 being relevant for that cushioning effect is the smallest dimension of the filler 7 that appears between a bottom face 4f of the side wall 4d and the multilayer substrate 7 in the vertical direction. When the filler 7 is not compressed, i.e. when the power semiconductor module is not pressed against a heat sink, the effective length d7 may be from 0.1 mm to 1 mm, or from 0.3 mm to 2 mm. It is pointed out that the surface 4f is designated as bottom surface because it is facing away from the upper side 4h of the housing cover and towards the multilayer substrate 3. A "bottom surface" of the side wall 4d is not necessarily that 4g of some surfaces 4f, 4g of the side wall 4d facing away from the upper side of the housing cover, which is furthermost distant from the upper side.

As the multilayer substrate 7 protrudes the mounting area 4a in the vertical direction towards the exterior of the power semiconductor module 1 by a distance d1, filler 7 will be compressed if the power semiconductor module 1 is pressed by use of the mounting area 4a against a heat sink with the multilayer substrate 3 ahead. The distance d1 may be, e.g., from 0.1 mm to 1 mm, or from 0.1 mm to 0.5 mm, or from 0.3 mm to 2.0 mm.

The power semiconductor module 1 includes an electrical circuit with the at least one power semiconductor chip 40.

This electrical circuit is electrically connected to at least one of the metal layers 11, 12, 13 of the multilayer substrate 3.

Hence, the border area, of the metal layers being electrically connected to the electrical circuit may be completely electrically insulated. In this spirit, the border area of a metal layer is the area which is accessible between the ceramic layers 21, 22 adjacent to the respective metal layer.

In general, all metal layers of the multilayer substrate 3 which are electrically connected to the electrical circuit may be completely insulated against any contact with air or gas inside and surrounding the module 1. The insulation may be realized by use of the soft potting 51 and/or the filler/glue 7. In FIG. 1, the bottom metal layer 13 is floating, i.e. not connected to the electrical circuit and therefore not completely insulated against contact with air or gas.

Optionally, the bottom layer of all metal layers 11, 12, 13 of the multilayer substrate which are electrically connected to the electrical circuit and all above metal layers may be insulated, e.g., at least in their boarder areas or completely, against contact with air or gas.

For assembling the power semiconductor module 1 the prepared multilayer substrate 3 may be equipped with the power semiconductor chips 40, the bonding wires 42, the printed circuit board 8, the bus bars 35 and 36, and the terminals 31, 32 and 34. Then, the equipped multilayer substrate 3 may be inserted with the terminals 31, 32, and 34 ahead in the housing cover 4 and glued to the side wall 4d of the housing cover 4. The glue may be applied additionally to the filler 7. Alternatively, the filler act both as filler and glue. Materials suitable as filler and/or glue are, e.g., silicone rubber or any other elastic glue.

Figure 2:
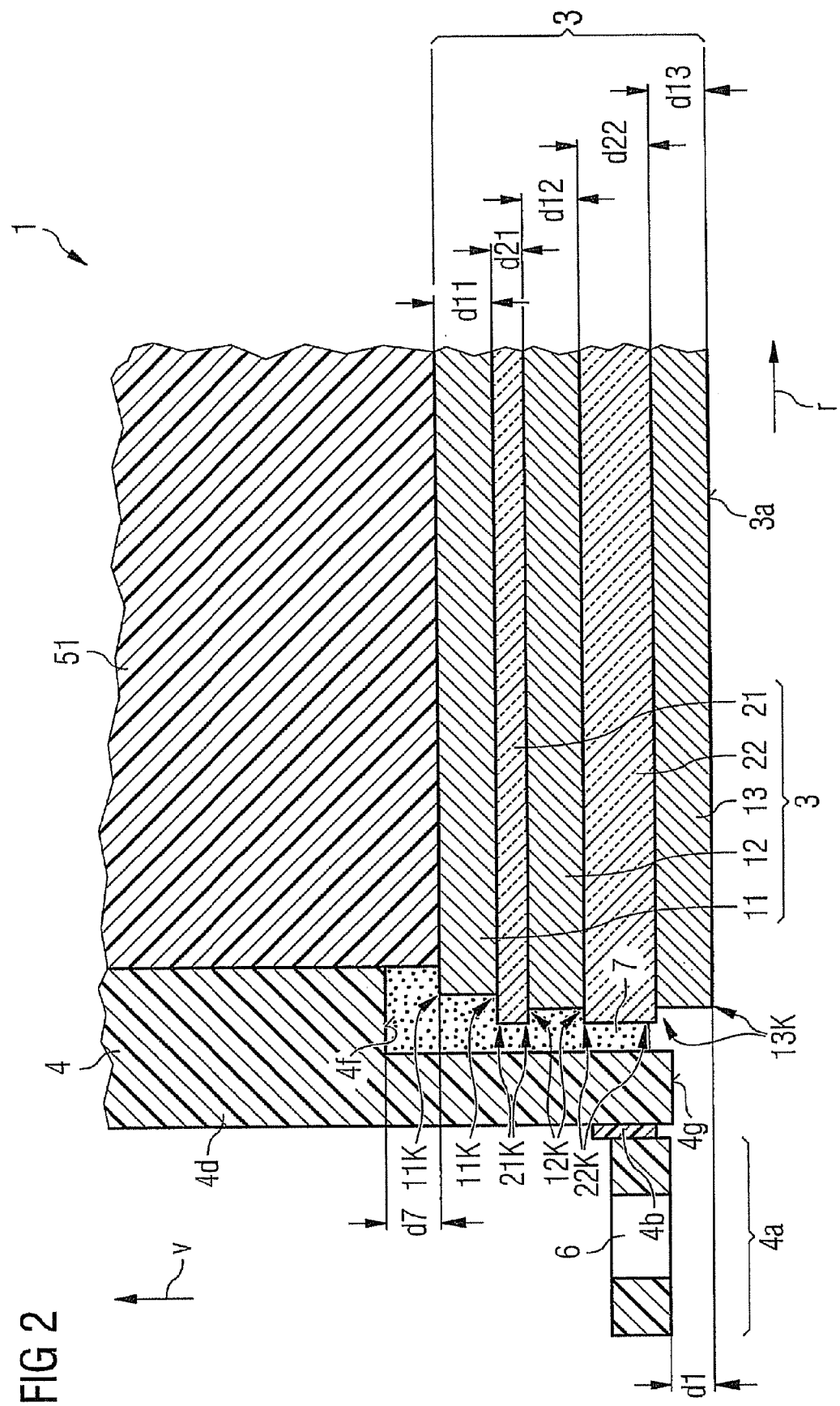
FIG. 2 illustrates an enlarged view of an edge area of the power semiconductor module of FIG. 1.

FIG. 2 illustrates a magnified section of the power semiconductor module 1 of FIG. 1. The section includes a mounting area 4a, the lower part of the side wall 4d and an outer edge of the multilayer substrate 3. The lower part of the side wall 4d includes a recess in which the multilayer substrate 3 and the top metal layer 11 extend in the lateral direction r. The gap between the side wall 4d and the multilayer substrate 3 is filled with filler 7. Each of the layers 11, 21, 12, 22, 13 of multilayer substrate 3 includes a main face facing towards the upper side of the housing cover 4, and a further main face facing away from the upper side of the housing cover 4. Each of the main faces of the layers 11, 12, 13, 21, 22 of the multilayer substrate 3 includes an outer edge 11k, 12k, 13k, 21k and 22k, respectively. In the context of the present invention the expression "outer edge" of a layer indicates an outer edge of the complete respective layer, which means, e.g., that an edge of a layer including sections distant from one another is not referred to as "outer edge" if it faces towards another section of that layer.

Filler 7 insulates the outer edges 11k, 12k of metal layers 11 and 12, respectively, the outer edges 21k of ceramic layer 21, and the outer edge 22k of ceramic layer 22 facing towards the center of the module 1. Such an insulation may be required if a high voltage, e.g., more than 1500 V, shall be applied to metal layers 11 and/or 12, as a contact between air and the metal layer may result in a partial discharge of the metal layer. In the embodiment of FIGS. 1 and 2, the bottom metal layer 13 of substrate 3 is electrically insulated against the metal layer 12 next to it and against the electric power circuit of the module by the bottom ceramic layer 22. Therefore, filler 7 covers only the outer edges of the upper metal layers 11 and 12 but not of the bottom metal layer 13.

The multilayer substrate 3 includes three metallization layers 11, 12, 13 and two ceramic layers 21, 22, which are arranged in the vertical direction v. Optionally, the multilayer substrate 3 may include additional metal layers and/or additional ceramic layers. One, some or all of the metal layers 11, 12, 13 may include thicknesses d11, d12, and d13, respectively, ranging from 0.05 mm to 2 mm, or from 0.25 mm to 2.5 mm. The ceramic layers 21, 22 may include thicknesses d21 and d22, respectively, ranging from e.g., 0.1 mm to 2 mm, or from 0.25 mm to 1 mm. The bottom metal layer 13 of the multilayer substrate 3 may include a thickness d13 of, e.g., less than 2 mm or less than 1 mm.

In the embodiment of FIG. 2, the metal layers 11, 12, 13 include identical thicknesses d11, d12 and d13, respectively, e.g., 0.5 mm. The upper ceramic layer 21 includes a thickness d21 of 0.25 mm, the lower ceramic layer 22 a thickness d22 of 0.38 mm or of 0.63 mm. The thickness d22 of the bottom ceramic layer 22 of the ceramic layers 21, 22 of the multilayer substrate 3 may be greater than or equal to the thickness d21 of any other ceramic layer 21 of the multilayer substrate 3. Further, the thickness d13 of the bottom ceramic layer 22 of the multilayer substrate 3 may be, e.g., less than 2 mm or less than 1 mm. In the lateral direction r, the ceramic layers 21, 22 extend beyond the metal layers 11/12 and 12/13, respectively, which are arranged next to the respective ceramic layer 21, 22. In particular, if the bottom layer 13 of the multilayer substrate 3 is a metal layer, the bottom ceramic layer 22 may extend beyond that bottom metal layer 13 in each lateral direction r being perpendicular to the vertical direction v.

The down pressure with which the multilayer substrate 3 is pressed against the heat sink 9 may be generated by use of a fastener in a mounting area 4a which may be a part of the housing cover 4. In the embodiment of FIGS. 1 and 2, the mounting area 4a includes mounting holes 6. The mounting area 4a which is provided at the exterior of the housing cover 4, may include plastic and/or metal parts and may be elastically attached to the housing cover 4 by use of an elastic connection 4b. The elastic connection 4b serves as pressure transfer element and as shock absorber. Such elastic connection 4b is designed with respect to the required down pressure and elongation and may be formed as elastic element, e.g., made of or including metal and/or plastics, for example an elastic metal or a plastic bend or a plastic sheet. An elastic connection 4b may be an integral part of the housing cover 4, e.g., a bar of a housing cover made of plastics. Alternatively, an elastic connection 4b may be joined to the housing cover 4, e.g., moulded to it.

Figure 3:
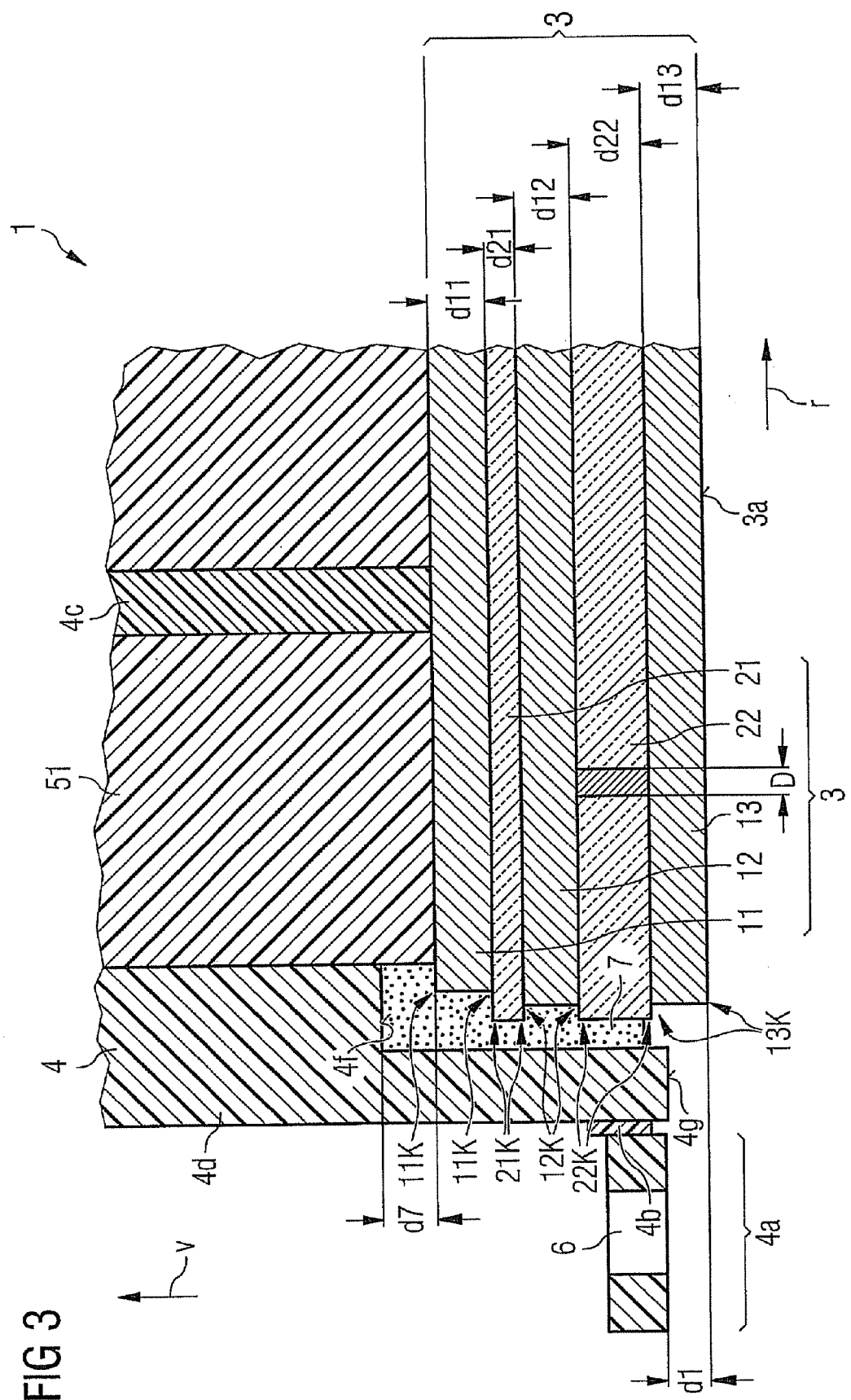
FIG. 3 illustrates a vertical cross sectional view of a modified edge area of the power semiconductor module of FIG. 1, wherein a ceramic layer of the multilayer substrate includes a via which electrically connects the metal layers which are arranged on opposite sides of the ceramic layer.

A modification of FIG. 2 illustrates FIG. 3 where at least one ceramic layer 22 of the ceramic layers 21, 22 of the multilayer substrate 3 includes one or more vias 10. The vias 10 may serve to electrically connect the metal layers 12 and 13 adjoining to opposite sides of the ceramic layer 22 in which the via 10 is formed. For example, the vias 10 may be formed cylindrical or as cylinder ring and include a diameter D of, e.g., less than 5 mm, or from 1 mm to 2.5 mm. In FIG. 3, the bottom layer 13 of substrate 3, i.e. the layer facing away from the center of the module 1, is a metal layer which is electrically insulated against the electric power circuit of module 1. However, an electric field generated by the electric power circuit may couple into bottom metal layer 13 and cause an electrical discharge in particular in the area of the outer edges 13k of bottom metal layer 13, as the highest strength of electric field occurs at locations where the surface of the metal layer includes its smallest radius of curvature. To reduce or avoid such electrical discharge, bottom metal layer 13 and the metal layer 12 next to it are electrically connected by at least one via 10, but electrically insulated against the electrical power circuit of the module 1 and, optionally, against all other metal layers 11 of the substrate 3. As metal layer 12 is electrically connected to the electric potential of bottom metal layer 13, the strength of the electric field that occurs at the outer edges 13k is reduced compared with the electric field that occurs at the outer edges 13k when the bottom layer 13 is electrically insulated against metal layer 12 next to it, because two metal layer with four outer edges 13k, 12k instead of only one metal layer with two outer edges 13k are connected to the same electric potential.

The ceramic layer 22 is arranged between the bottom metal layer 13 and the metal layer 12 next to the bottom metal layer 13. The upper of the outer edges 22k of the ceramic layer 22 faces away from the bottom metal layer 13. Filler 7 covers, e.g., completely, at least that upper of the outer edges 22k. Optionally, filler 7 may also cover the outer edges 12k, 21k and 11k of one, some or all layers 12, 21, 11 of substrate 3 which are arranged on the side of ceramic layer 22 facing away from the bottom metal layer 13.

As also illustrated in FIG. 3, an optional mechanical support may be applied to the multilayer substrate 3 by one or more posts 4c which are spaced apart from the outer edges of the multilayer substrate 3. The posts 4c may be a part of the housing cover 4 or be separate therefrom.

Figure 4:
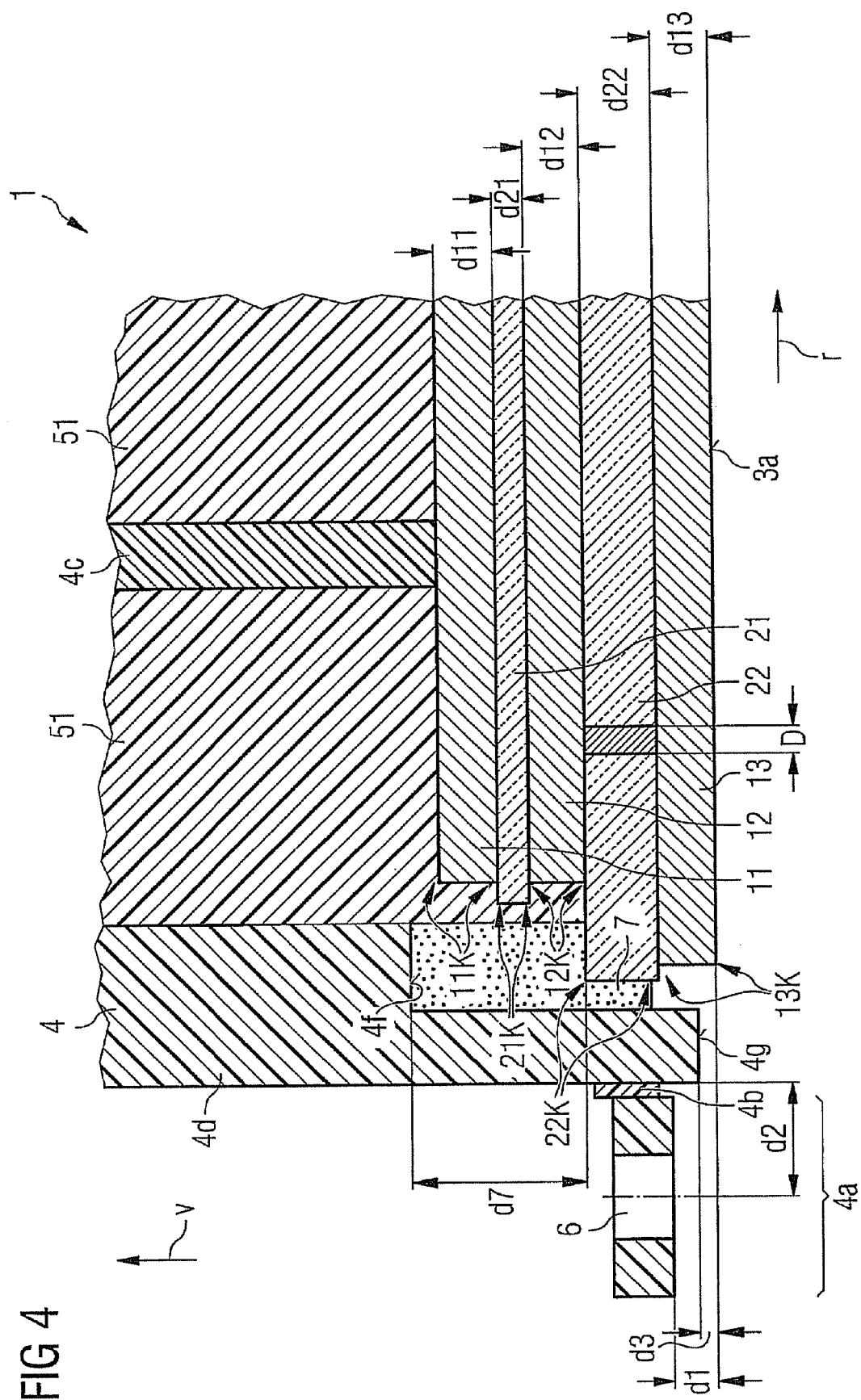
FIG. 4 illustrates a vertical cross sectional view of another modified edge area of the power semiconductor module of FIG. 1, wherein the side wall of the housing cover of the module is formed to perform a contact pressure against one of the ceramic layers of the module.

In the embodiments of FIGS. 1, 2 and 3, the down pressure from the side wall 4d of the housing cover 4 affects the top layer 11 of the multilayer substrate 3. Alternatively, as illustrated in FIG. 4, it is not required that the down pressure affects the top metal layer 11 of the multilayer substrate 3. In the embodiment of FIG. 4, the down pressure caused by the side wall 4d of the housing cover 4 affects the ceramic layer 22. To allow for this, the ceramic layer 22 extends beyond the above layers 11, 21 and 12 of the multilayer substrate 3.

Figure 5:
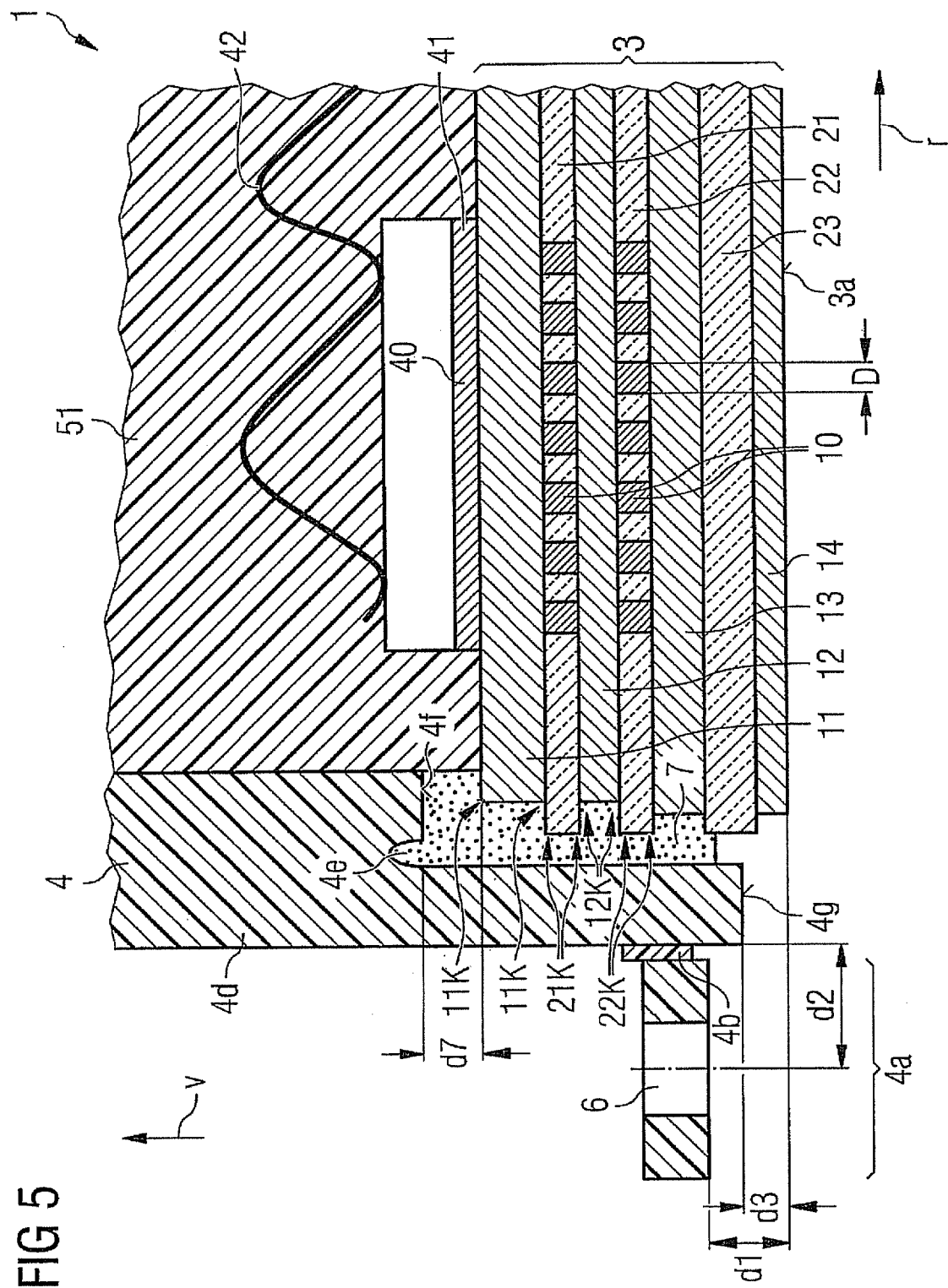
FIG. 5 illustrates a vertical cross sectional view of still another edge area of the power semiconductor module of FIG. 1, wherein the base plate includes more than three metal layers and more than two ceramic layers, and wherein some of the ceramic layers include vias which are arranged below a semiconductor chip.

As can be seen from FIG. 5, the multilayer substrate 3 may also include more than three metal layers 11, 12, 13, 14 and more than three ceramic layers 21, 22, 23. To improve heat dissipation from a power semiconductor chip 14 being disposed on the multilayer substrate 3, one, some or all of the ceramic layers 21, 22, 23 of the multilayer substrate 3 may include a number of vias 10 in their respective areas below the power semiconductor chip 40. Additionally, the vias 10 may serve to electrically connect adjacent metal layers. In the recess of the lower part of the side wall 4d of the housing cover 4 an optional trench 4e is provided. This trench 4e serves as reservoir for filler 7 when gluing the multilayer substrate 3 to the housing cover 4.

From FIGS. 2 to 5 it can be seen that if the power semiconductor module 1 is attached to but not yet pressed against a heat sink with the multilayer substrate 3 ahead, the housing cover 4 is distant from the heat sink. When down pressure increases, filler 7 will be compressed. However, the down pressure affecting the multilayer substrate 3 may be limited to a predefined value by dimensioning the distance d7 and/or the distance d3 between the lower end of the side wall 4d and the bottom of the multilayer substrate 3 in the vertical direction v. This limitation results from the lower end of the side wall 4d which will contact the heat sink when the down pressure increases. As soon as the side wall 4 is in contact with the heat sink, a further increasing down force affecting the housing cover 4 will not result in a further increasing down force affecting the multilayer substrate 3. The distance d3 may range, e.g., from 0 μm to 50 μm, or from 50 μm to 300 μm.

A further limitation of the down force affecting the multilayer substrate 3 may be achieved by determining the distance d2 between the side wall 4d of the housing cover 4 and the center of the mounting holes 6. The distance d2 may be, e.g., greater than or equal to 10 mm.

Figure 6:
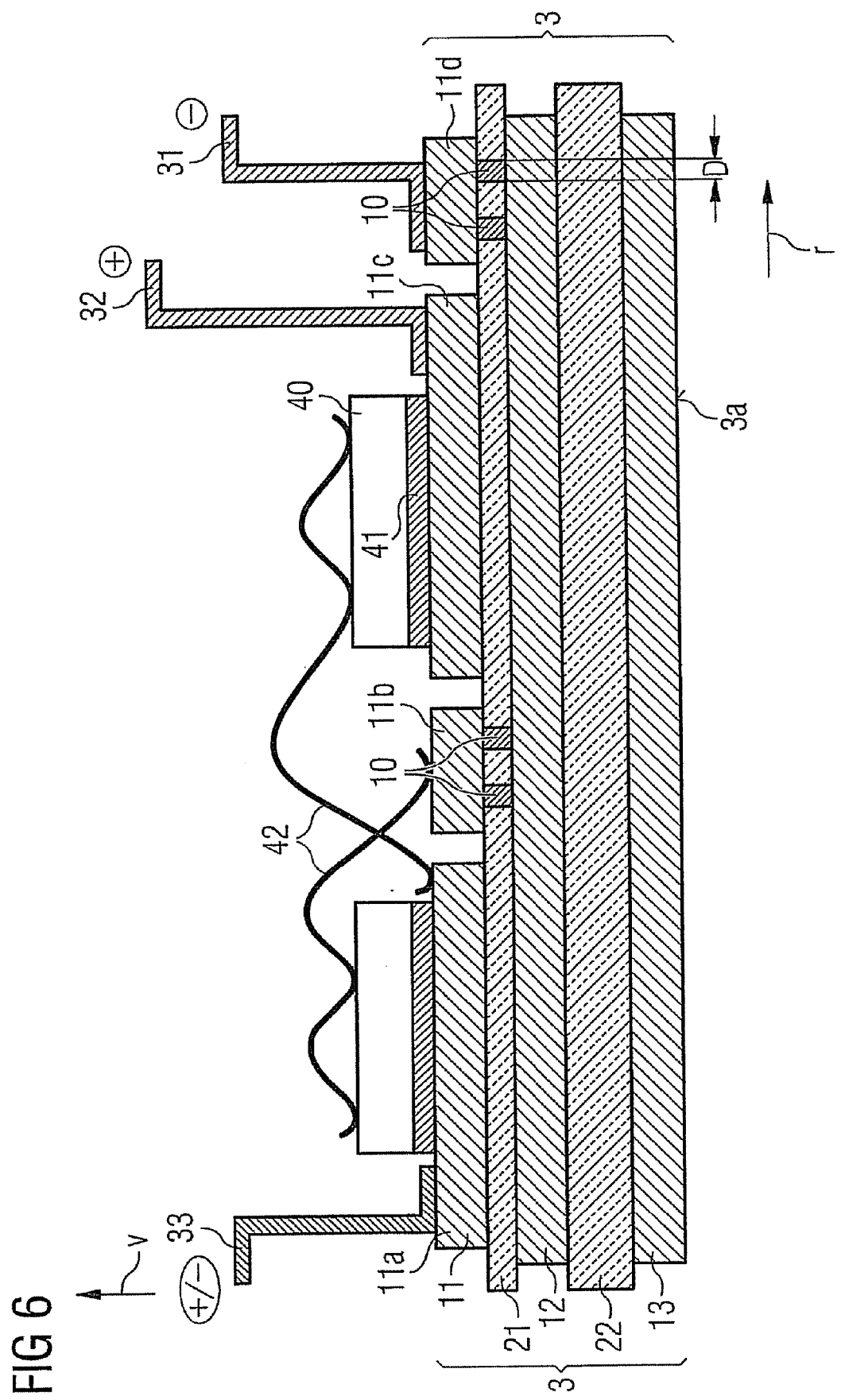
FIG. 6 illustrates a vertical cross sectional view of an embodiment of a multilayer substrate where the top layer is a structured metal layer, and which is equipped with power semiconductor chips and power supply terminals, wherein an output terminal is located opposite the power supply terminals.

FIG. 6 is a vertical cross sectional view of a multilayer substrate 3 equipped with power semiconductor chips 40 and with terminals 31, 32 and 33. The power semiconductor chips 40 are electrically connected to form a half bridge. The electrical connections of the equipped multilayer substrate 3 are realized by bonding wires 42 and by sections 11a, 11b, 11c, 11d of the top metal layer 11, vias 10 and the metal layer 12. The terminals 31, 32 may be soldered or welded to the sections 11d, 11c, respectively, and serve as power supply terminals. Accordingly, the terminal 33 may be soldered or welded to the section 11a of the top metal layer 11 and serve as phase output layer. The electrical connection between the bottom of one of the power semiconductor chips 40 (the left one in FIG. 3) and the power supply terminal 31 is realized by use of the bonding layer 41, vias 10 and metal layer 12. For example, the power supply terminals 31, 32 on the one hand and the phase output terminal 33 on the other hand may be arranged in opposite boarder areas of the multilayer substrate 3.

Figure 7:
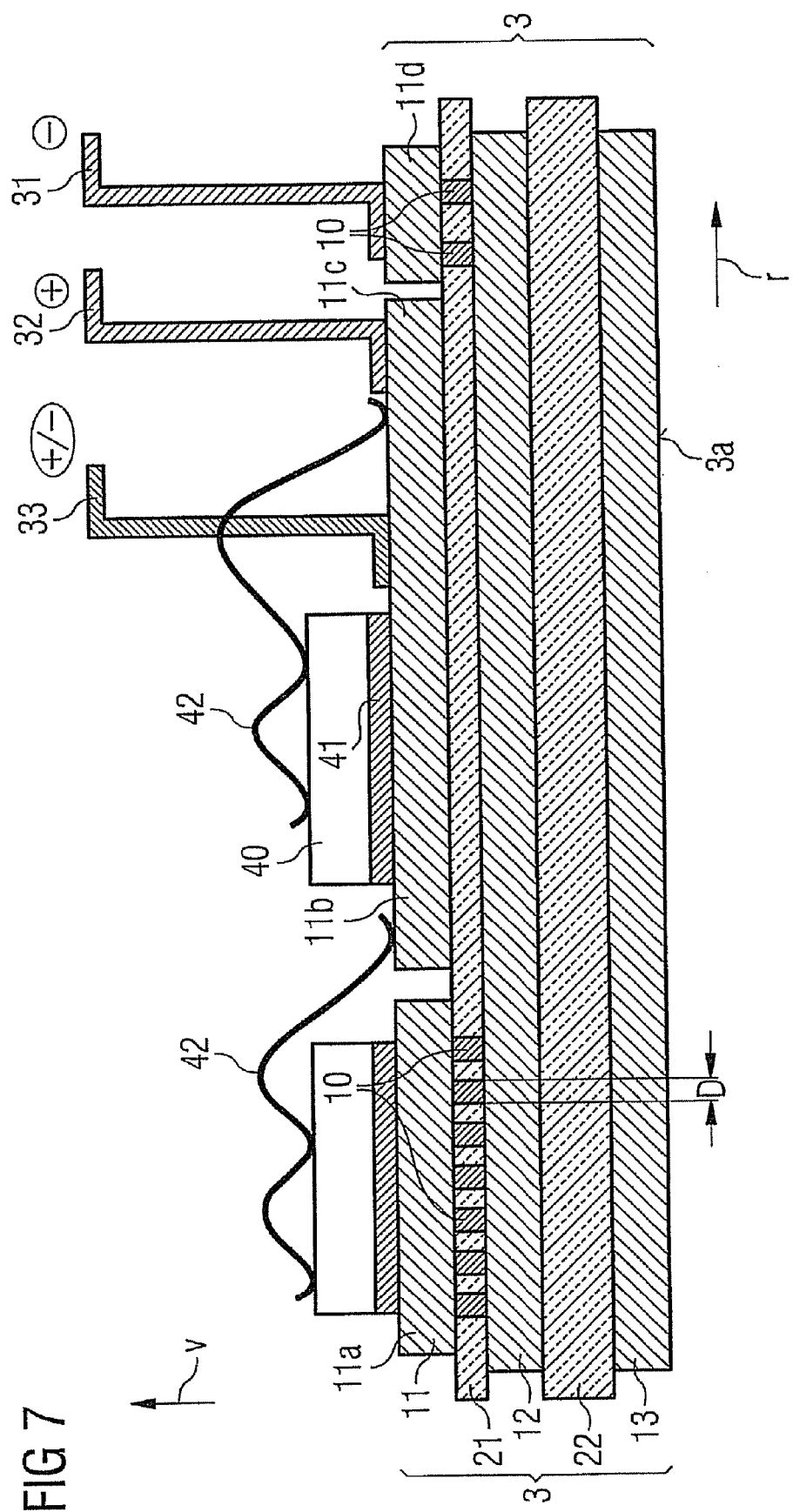
FIG. 7 illustrates a vertical cross sectional view of another embodiment of an equipped multilayer substrate where one of the ceramic layers includes a number of vias arranged below a power semiconductor chip, and where two power supply terminals and an output terminal are arranged in the same edge area of the multilayer substrate.

As can be seen from FIG. 7, the power supply terminals 31, 32 and the phase output terminal 33 may be arranged within the same boarder area of the multilayer substrate 3.

Figure 8:
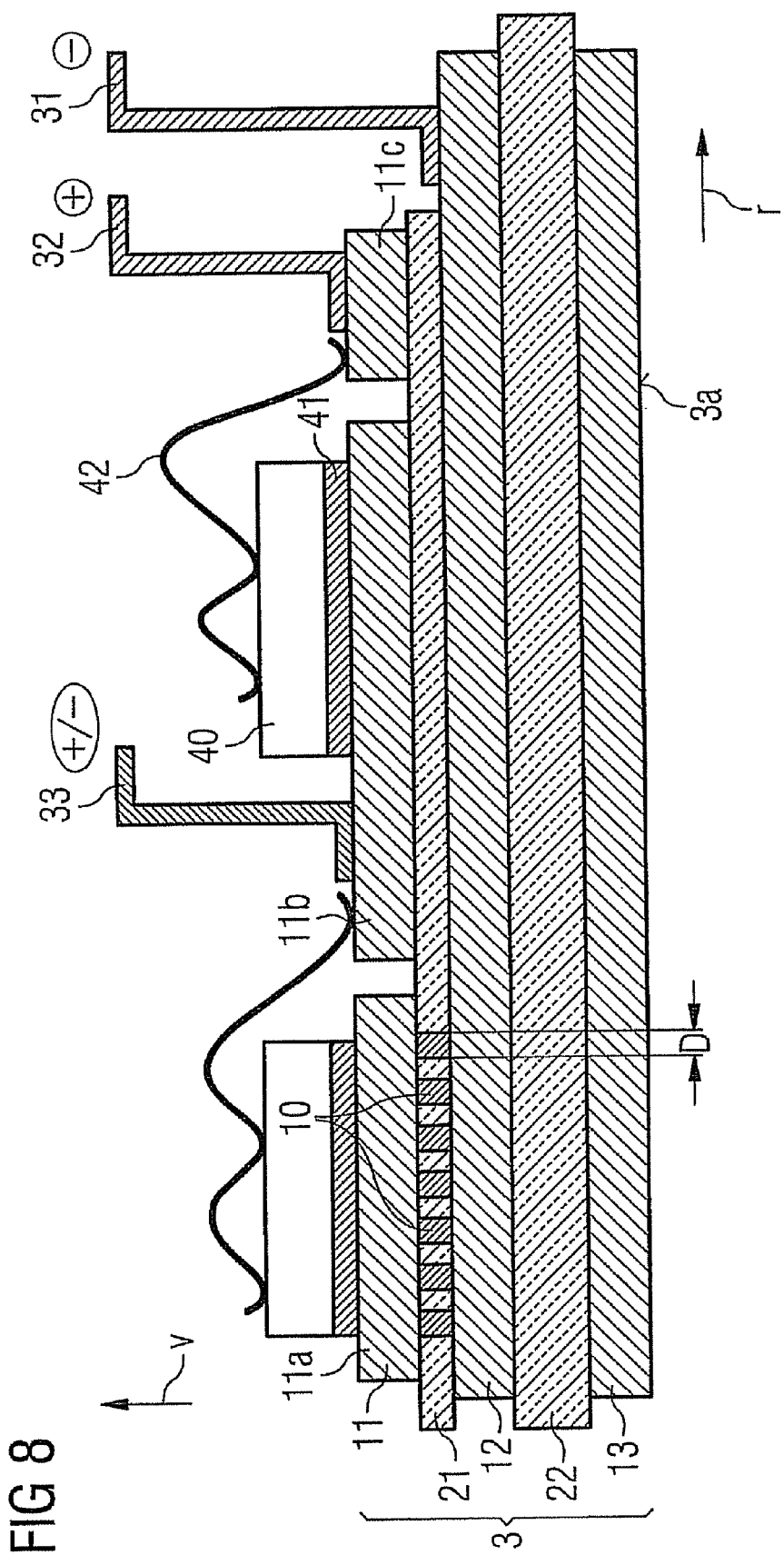
FIG. 8 illustrates a vertical cross sectional view of an equipped multilayer substrate, in which one of the power supply terminals is directly soldered or welded to a metal layer which is different from the top metal layer.
Figure 9:
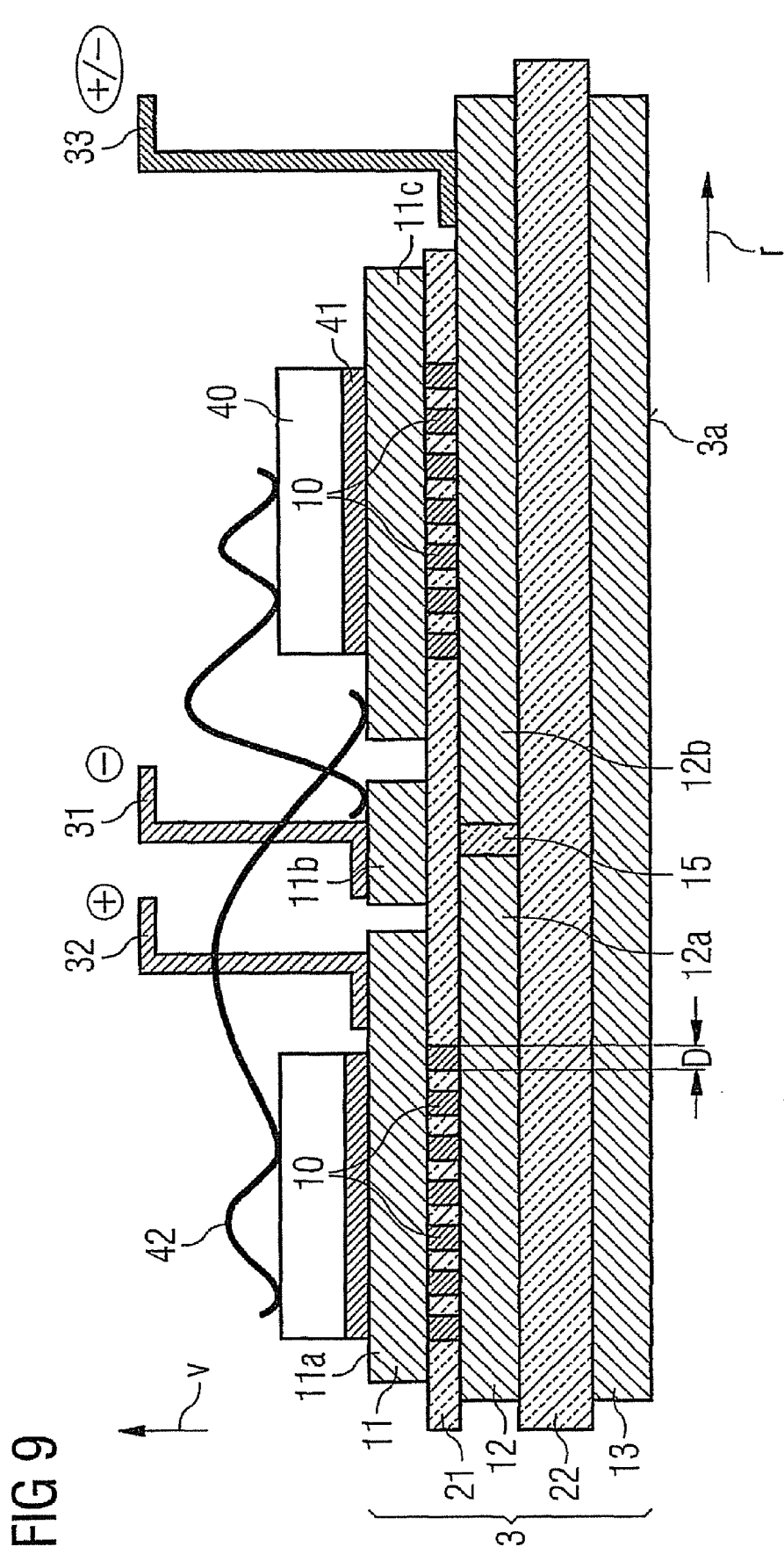
FIG. 9 illustrates a vertical cross sectional view of an equipped multilayer substrate in which the output terminal is directly soldered or welded to a metal layer different from the top metal layer.

According to another embodiment which is illustrated in FIG. 8, the power supply terminals 31, 32 are arranged in the same boarder area of the multilayer substrate 3, whereas the phase output terminal 33 is arranged in the inner area of the multilayer substrate 3. Likewise, the phase output terminal 33 may be arranged in a boarder area of the multilayer substrate 3, whereas the power supply terminals 31, 32 are arranged in an inner area of the multilayer substrate 3, which can be seen from FIG. 9. In FIG. 8 the power supply terminal 31 and in FIG. 9 the phase output terminal 33 are not soldered or welded to the top metal layer 11 but to another 12 of the remaining metal layers 12, 13. In FIG. 9, metal layer 12 includes sections 12a and 12b which are arranged distant and electrically insulated from one another by a dielectric 15.

In the embodiments of FIGS. 6 to 9, the bottom metal layer 13 of the multilayer substrate 3 is electrically insulated against metal layer 12 next to it. Alternatively, the bottom layer of the multilayer substrate 3 may also be electrically connected with the power semiconductor chips 40.

Figure 10:
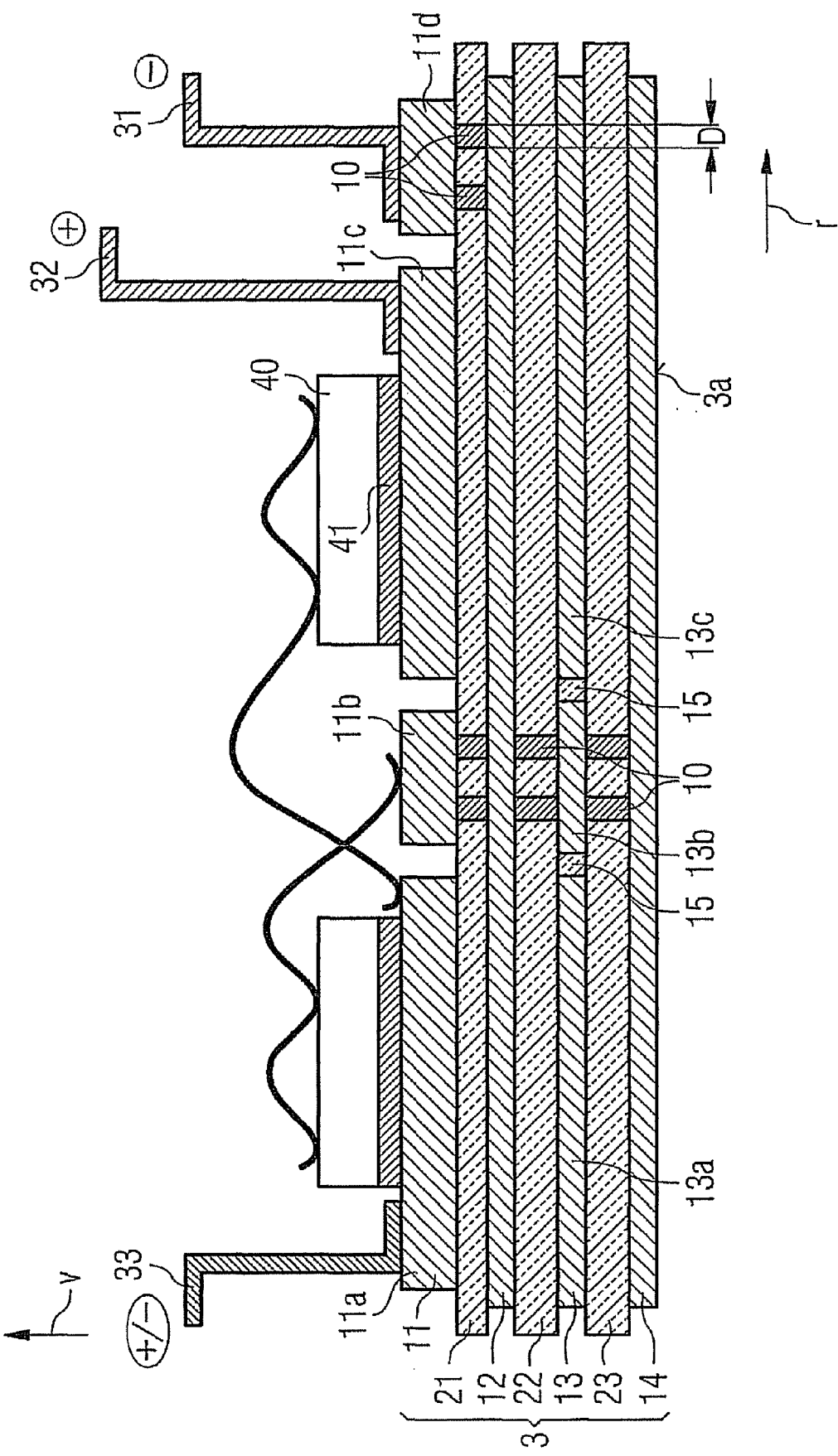
FIG. 10 illustrates a vertical cross sectional view of an equipped multilayer substrate including four metal layers and three ceramic layers, where one of the metal layers being different from the top metal layer includes sections which are spaced apart from one another.

In the embodiment of FIG. 10, which illustrates an equipped multilayer substrate 3 with four metal layers 11, 12, 13, 14 and three ceramic layers 21, 22, 23, the bottom metal layer 14 is electrically connected to the power supply terminal 31 for the negative power supply voltage. Alternatively, the bottom metal layer 14 may be electrically connected with the power supply terminal 32 for the positive power supply voltage, or with the phase output terminal 33. As also illustrated in FIG. 10, for electrically connecting the power semiconductor chips 40 also one or more of the lower metal layers 12, 13, 14 may be used. In FIG. 10, metal layer 13 includes sections 13a, 13b and 13c which are arranged distant from one another and electrically insulated by a dielectric 15. The dielectric 15, e.g., the unsintered "green" ceramics, may be filled, e.g., pressed, in grooves during the manufacturing process of the multilayer substrate, followed by a sintering step. The grooves may be filled with material identical with the material of one of the ceramic layers 22 or 23 adjacent to metal layer 13 in which the dielectric is arranged. Alternatively or additionally, the grooves may be filled with dielectric potting, e.g., made of plastics, for example polyimide, epoxy, or silicone, via openings which are provided in the metal layers and in the ceramic layers above the groove to be filled. Afterwards, the potting may be hardened, e.g., during a tempering step.

The embodiments of FIGS. 6 to 10 illustrate multilayer substrates 3 being equipped with power semiconductor chips 40 and with terminals 31, 32, 33 only. However, these equipped multilayer substrates 3 may be completed to power semiconductor modules including the options as described with reference to FIGS. 1 to 5 and to below FIGS. 11 to 17.

If a plane multilayer substrate 3 is pressed against the heat sink by a down pressure as explained with reference to FIG. 1 and the down pressure affects the multilayer substrate 3 for instance in its boarder area, the multilayer substrate 3 will lift off from the heat sink in the inner area of the multilayer substrate 3. Likewise, if the down force which presses the multilayer substrate 3 against a heat sink in the inner area of a plane multilayer substrate 3, the multilayer substrate 3 will lift off from the heat sink 9 in the boarder area of the multilayer substrate 3. In both cases, the heat transmission resistance between the multilayer substrate 3 and the heat sink 9 will increase because of the reduced heat conductivity in the lift-off areas.

Figure 11:
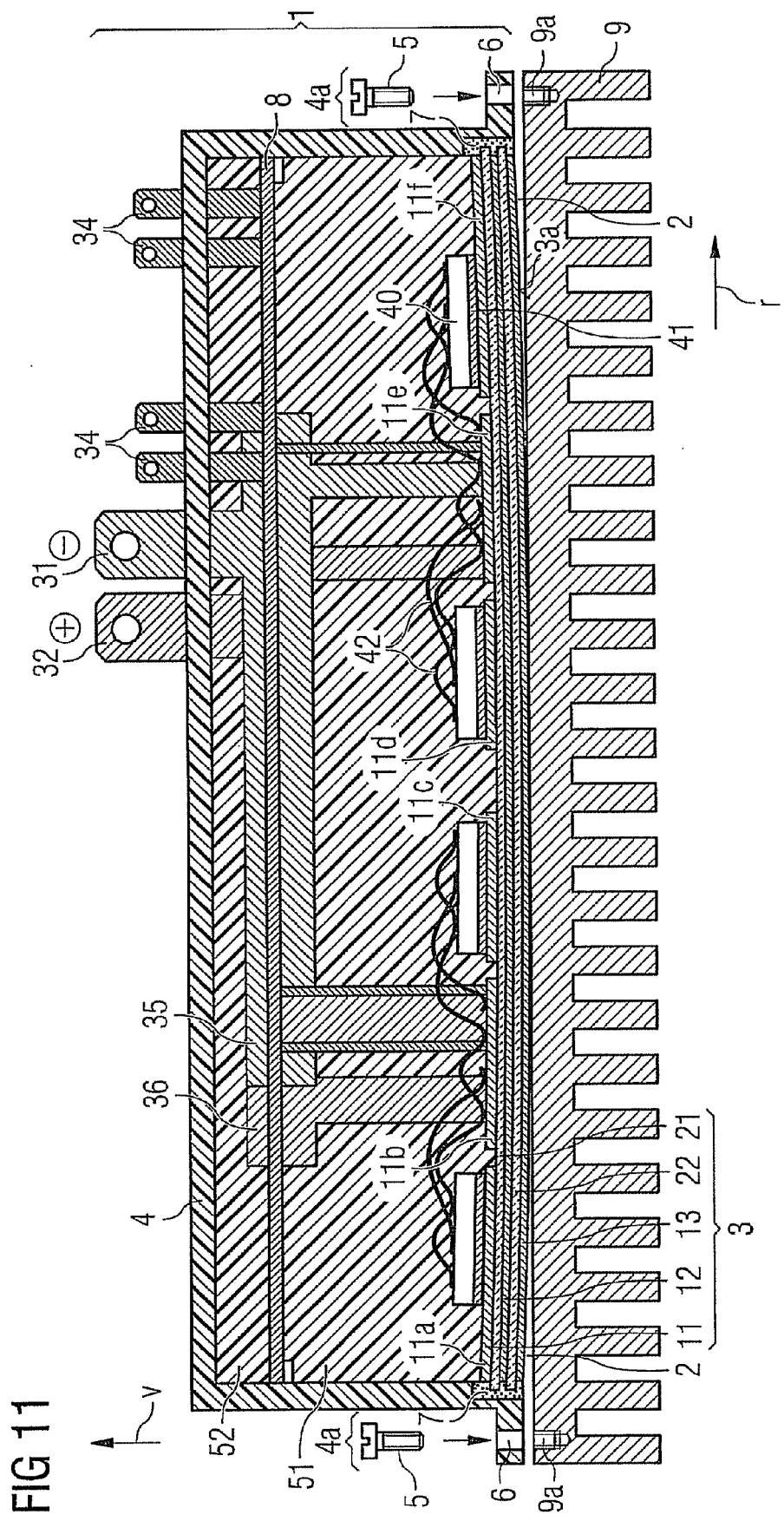
FIG. 11 illustrates a vertical cross sectional view of an equipped multilayer substrate of a power semiconductor module to be pressed against a heat sink, where the multilayer substrate is formed convex relative to the center of the power semiconductor module.

As illustrated in FIGS. 11 and 12, this may be avoided by using a pre-curved multilayer substrate 3. In FIG. 11, the multilayer substrate 3 is pre-curved convex relative to the center of the power semiconductor module 1 which can be seen from areas 2 in which the multilayer substrate 3 is spaced apart from the heat sink 9. If a down force affects the multilayer substrate 3 in the boarder area of the multilayer substrate 3 to press the substrate 3 against the plane surface of the heat sink 9, the multilayer substrate 3 will deform from its pre-curved shape to an almost plane multilayer substrate 3.

In FIG. 12, the multilayer substrate 3 is pre-curved concave relative to the center of the power semiconductor module 1 which can be seen from an area 2 in which the multilayer substrate 3 is spaced apart from the heat sink 9. If a down pressure which is created by a center screw 5 and transmitted by a post 4c of the housing cover 4 affects the multilayer substrate 3 in the center area of the multilayer substrate 3, the substrate 3 is pressed against the plane surface of the heat sink 9 and the multilayer substrate 3 will deform from its pre-curved shape to an almost plane multilayer substrate 3. At the lower end of the post 4c a filler 7 may be provided. This filler may include the same properties as the filler 7 between the lower ends of the side walls 4d.

In the embodiments described above the power semiconductor modules may include at least one power semiconductor chip. The following FIGS. 13 to 17 illustrate circuit diagrams of embodiments of power semiconductor modules 1 including a multilayer substrate as described above.

Figure 13A:
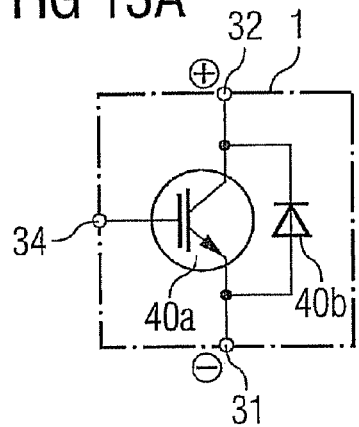
FIG. 13a illustrates a circuit diagram of power semiconductor module including a single switch.
Figure 13B:
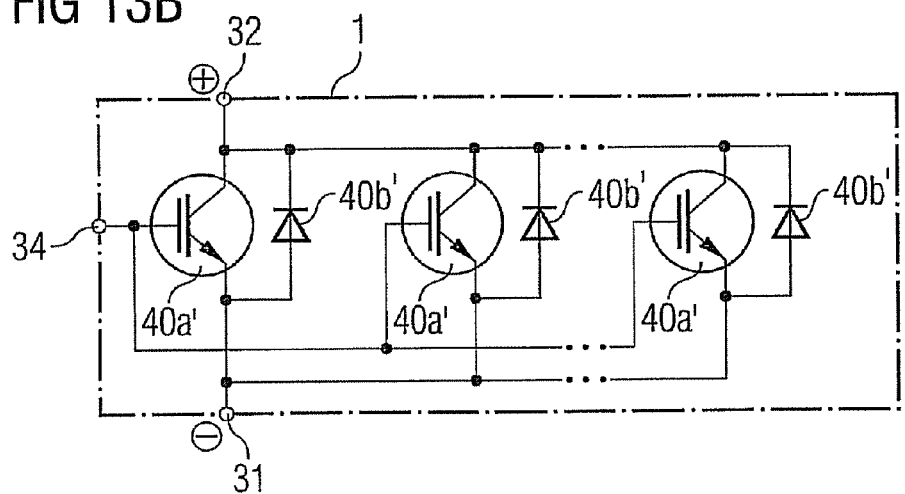
FIG. 13b illustrates a circuit diagram of power semiconductor module including a single switch, where a number of semiconductor chips are switched parallel to one another.

FIG. 13a is a circuit diagram of a single switch power semiconductor module 1. The single switch includes an IGBT 40a and an optional free wheeling diode 40b switched antiparallel to IGBT 40a. For its external connections the module 1 includes terminals 31, 32 for power supply, and a control terminal 34. The IGBT 40a may consist of a single semiconductor chip, or alternatively, as illustrated in FIG. 13b, include a number of semiconductor chips 40a' switched parallel to one another.

Figure 14:
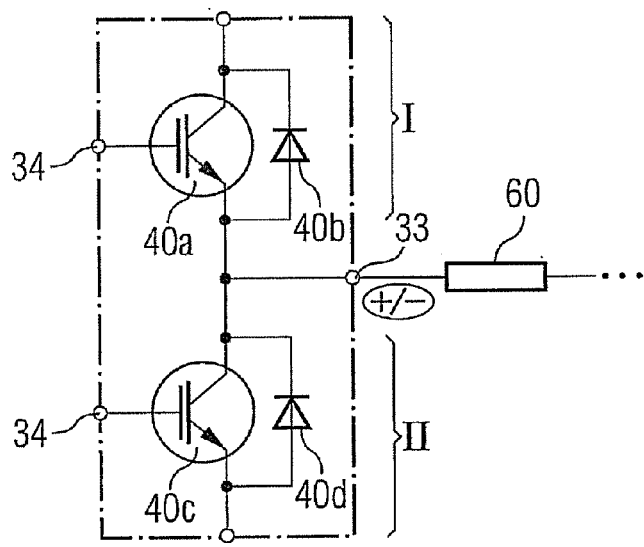
FIG. 14 illustrates a circuit diagram of power semiconductor module including a half bridge ("phase leg").

FIG. 14 is a circuit diagram of a half bridge power semiconductor module 1. The half bridge ("phase leg") includes an upper leg I and a lower leg II. The upper leg I includes an IGBT 40a and an antiparallel free wheeling diode 40b, the lower leg an IGBT 40c and an antiparallel free wheeling diode 40d. The IGBTs 40a, 40c are connected in series. During normal operation, none or one of but not both IGBTs 40a, 40c are switched on at the same time. Such a half bridge allows for connecting one of the electric potentials applied to the power supply terminals 31 and 32 with the phase output terminal 33 and to a load 60 connected therewith.

Figure 15:
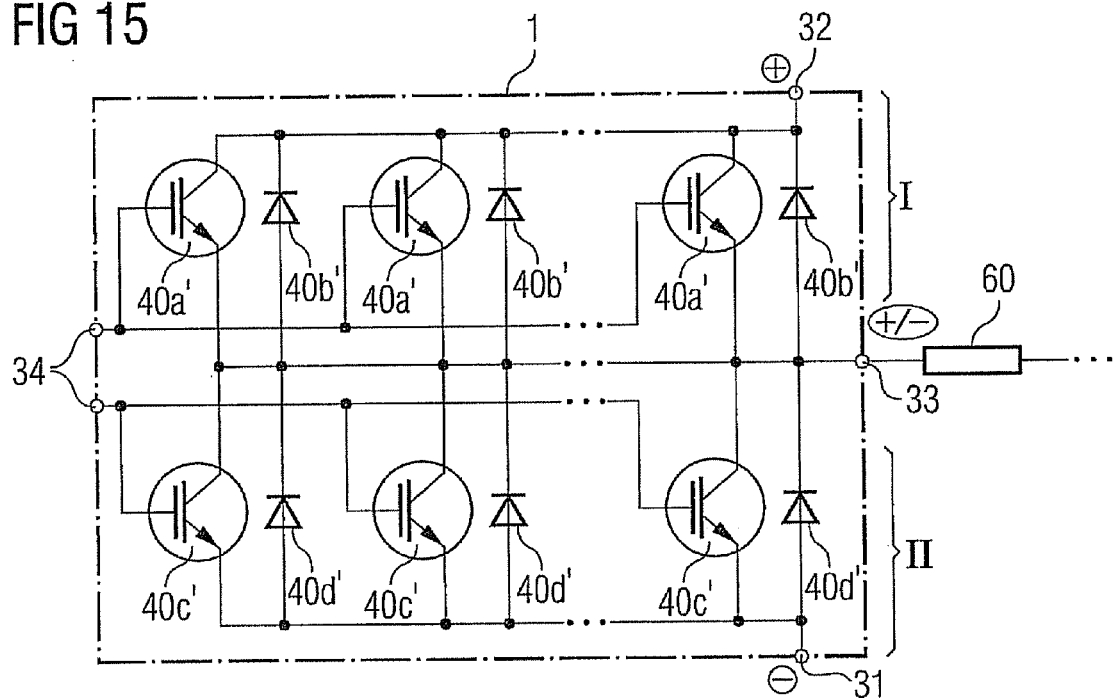
FIG. 15 illustrates a circuit diagram of power semiconductor module including a three phase legs as illustrated in FIG. 14 connected parallel to one another.

To improve ampacity, instead of just one IGBT and one freewheeling diode per leg I, II each of the legs I, II may include more than one IGBT and/or more than one freewheeling diode. FIG. 15 is a circuit diagram of such a power semiconductor module 1. The upper leg I includes a number of IGBTs 40a' connected parallel to one another, and a number of freewheeling diodes 40b' connected parallel to one another. The IGBTs are connected antiparallel to the freewheeling diodes. In the same way, the lower leg II includes a number of IGBTs 40c' and freewheeling diodes 40d' that are connected to one another.

Figure 16:
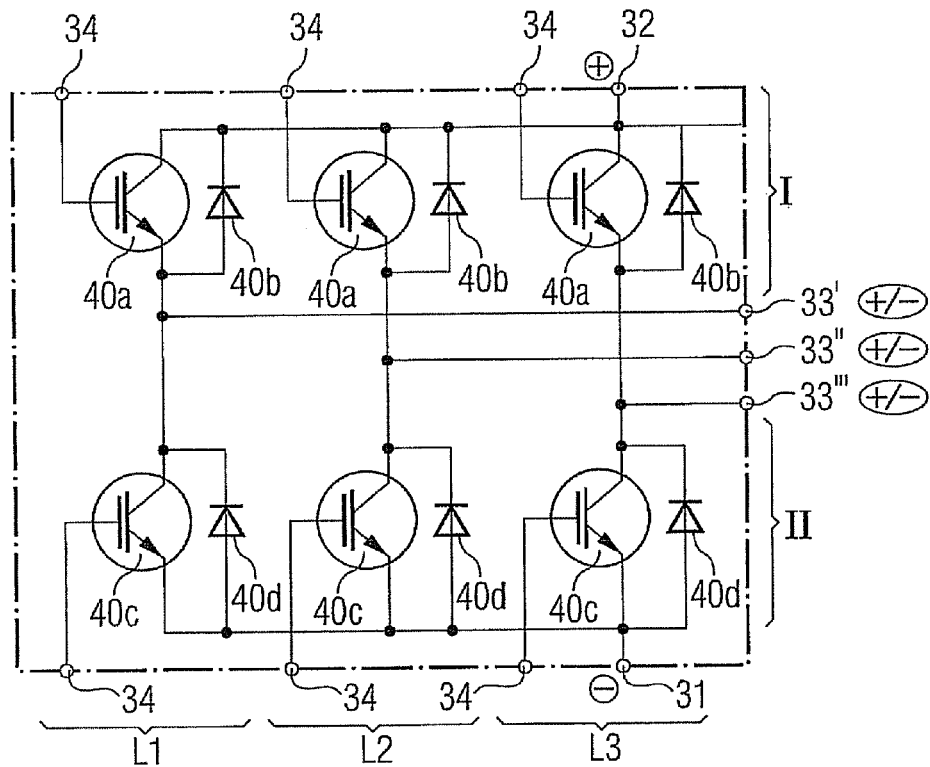
FIG. 16 illustrates a circuit diagram of power semiconductor module including a three phase legs as illustrated in FIG. 14 with separate phase output terminals ("six pack").

FIG. 16 is a circuit diagram of a power semiconductor module 1 including three phase legs L1, L2, L3 as illustrated in FIG. 14. The phase outputs of the phase legs L1, L2, L3 are connected to independent phase output terminals 33', 33'', 33''', respectively, independent from one another. The control inputs of the IGBTs 40a, 40c are also independent from one another and connected to independent control input terminals 34. As illustrated in FIG. 16, the phase legs L1, L2, L3 may include common power supply terminals 31, 32. Alternatively, one, some or all of the phase legs L1, L2, L3 may include individual power supply terminals.

FIG. 17 illustrates an embodiment of a power semiconductor module 1 including a H-Bridge. The module includes two half bridges 1a and 1b each of which is designed similar to the half bridge described with reference to FIG. 14. The output of the half bridge 1a is electrically connected to a first phase output terminal 33a, the output of the half bridge 1b to a second phase output terminal 33b. An external load 61, e.g., a motor, is connected to the phase output terminals 33a, 33b. Dependent on input signals applied to control terminals 34 of the module 1 the direction of rotation as well as the rotational speed of the motor 61 can be varied. For example, if the IGBTs in the upper leg Ia of half bridge 1a and in the lower leg IIb of half bridge 1b are switched on and the IGBTs in the upper leg Ib of half bridge 1b and in the lower leg IIa of half bridge 1a are switched off, the direction of rotation of the motor is opposite to the direction of rotation when the IGBTs in the upper leg Ia of half bridge 1a and in the lower leg IIb of half bridge 1b are switched off and the IGBTs in the upper leg Ib of half bridge 1b and in the lower leg IIa of half bridge 1a are switched on.

With reference to FIGS. 13 to 17, a single switch, a half bridge, "six pack" and a H-bridge have been described. However, other embodiments may relate to power semiconductor modules including other configurations including one or more power semiconductor chips, e.g., power semiconductor modules which are designed as full inverter ("six pack"), or subunits thereof.

The power semiconductor modules described in FIGS. 1 to 12 include multilayer substrates 3. Each of the multilayer substrates 3 includes at least three metal layers and at least two ceramic layers. Such a metal layer may, e.g., consist of copper, aluminum, or silver, or include at least one of these metals, e.g., an alloy. In case of an alloy, also other materials may be included. Optionally, a metal layer may include sublayers. Each of the ceramic layers of such a multilayer substrate 3 may, e.g., consist of or include $Al_2O_3$ (aluminum oxide), AlN (aluminum nitride), or $Si_3N_4$ (silicon nitride). The multilayer substrates 3 may be manufactured using an AMB process (AMB=active metal brazing), a DAB process (DAB=direct aluminum bonding), or a DCB process (DCB=direct copper bonding).

One way for producing a multilayer substrate is to stack metal layers and ceramic layers alternately and successively and afterwards bonding the stacked layers to one another by applying pressure and high temperature to the stack. The required temperature depends on the selected bonding process. The metal layers and/or the ceramic layers may be structured prior to stacking. Optionally, the ceramic layers may be provided prior to bonding with openings in which electrically conductive material, e.g., copper balls or a silver paste, is inserted. In case of stacking and bonding structured metal layers and/or ceramic layers the metal layers and/or ceramic layers may be aligned prior to the bonding step.

In a further way, some of the metal layers and some of the ceramic layers may be bonded separately to form a sub-substrate. Afterwards, such a sub-substrate may be joined with further metal layers and/or further ceramic layers and/or further sub-substrates. As far as it is accessible, the area of a metal layer of a sub-substrate may be structured prior to joining the sub-substrate with the further metal layers and/or further ceramic layers and/or further sub-substrates. A sub-substrate may comprise, e.g., one ceramic layer which is joined with one metal layer, or with two metal layers which are arranged on opposite sides of the ceramic layer and joined therewith. For both ways, AMB, DAB, DCB may apply as joining technique. Other techniques are vacuum soldering, LTJT, TLP soldering (TLP=transient liquid phase), or gluing with a conductive glue.

FIG. 18 illustrates different processes of a procedure for manufacturing a sub-substrate of a multilayer substrate. According to FIG. 18a two metal layers 11', 12' and a ceramic layer 21' are provided. In an optional step, an opening 18 may be created in the ceramic layer 21 (FIG. 18b). In the opening 18 a conductive material 10, e.g., a silver paste or a copper ball, may be inserted (FIG. 18c). Afterwards, the metal layers 11', 12' and the ceramic layer 21' may be stacked such that ceramic layer 21' is arranged between the metal layers 11', 12' (FIGS. 18d and 18e). Between adjacent layers 11', 12', 21' additional material, e.g., silver paste or glue, may be arranged to improve the joining properties. Then this stacked arrangement is clamped between clamping jaws 20 (FIG. 18f) such that the layers 11', 12', 21' are pressed to one another. During clamping the temperature of the stack may be increased. FIG. 18g illustrates the sub-substrate 3' after releasing the pressure. The sub-substrate 12' including two metal layers 11', 12' and a via 10 results (FIG. 18g).

Figure 18A:
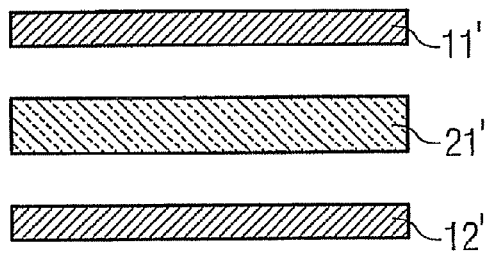
FIGS. 18A-18H illustrate different processes of a procedure for manufacturing a sub-substrate of a multilayer substrate.
Figure 18B:
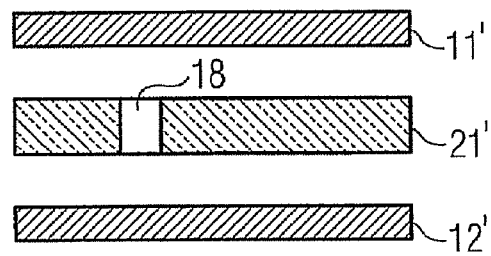
Figure 18C:
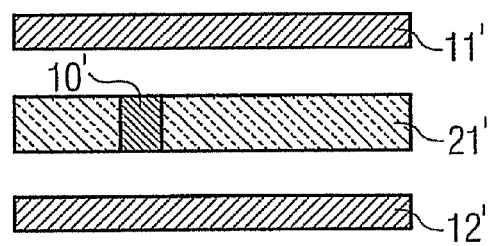
Figure 18D:
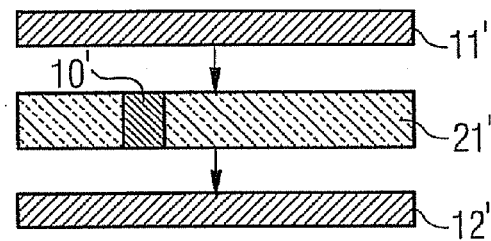
Figure 18E:
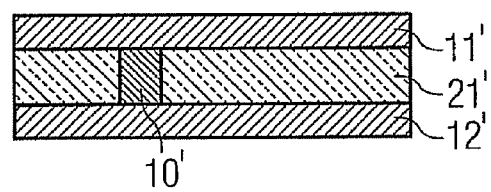
Figure 18F:
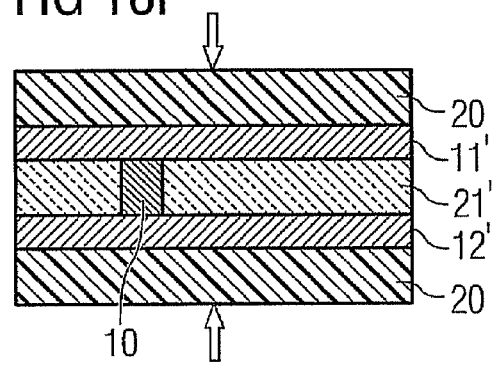
Figure 18G:
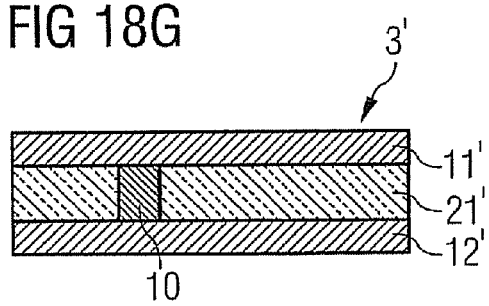
Figure 18H:
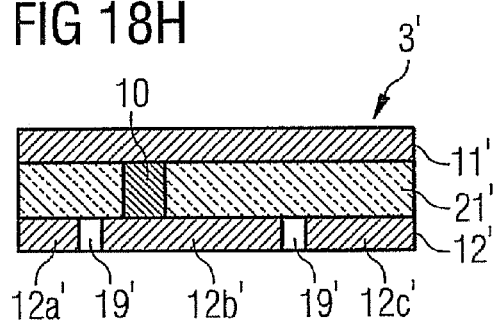

Optionally, grooves 19' may be produced in at least one of the metal layers 11', 12'. Due to the grooves 19' the respective metal layer 12' is divided into sections 12a', 12b', 12c' distant and electrically insulated from one another (FIG. 18h). The grooves 19' may be produced by conventional masking and etching technique. Alternatively, grooves 19' may be produced by milling.

Instead of producing a sub-substrate including one ceramic layer 12' and two metal layers 11', 12', sub-substrates including one ceramic layer and just one metal layer may be manufactured in a corresponding way. A further modification may be a sub-substrate including a metal layer which is arranged between two ceramic layers.

Figure 19A:
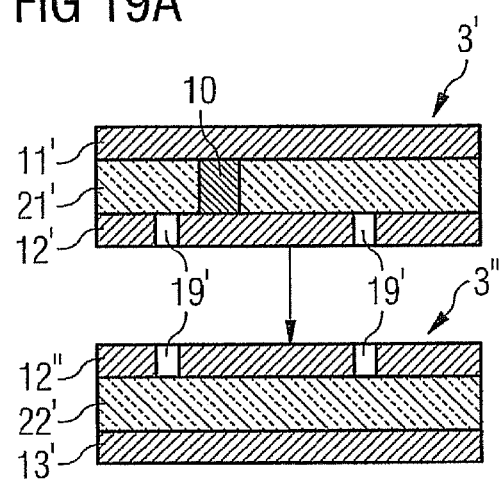
FIGS. 19A-19D illustrate different processes of a procedure for manufacturing a multilayer substrate.
Figure 19B:
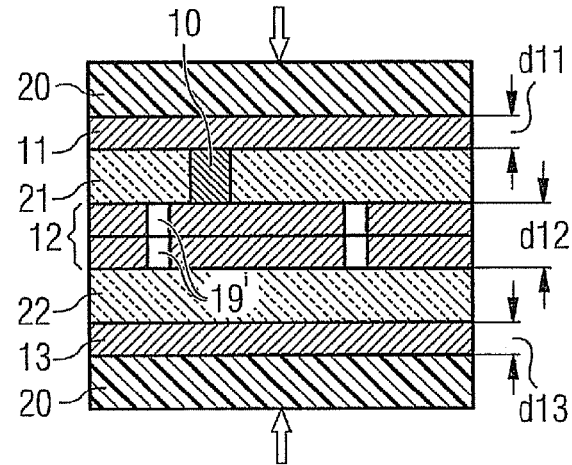
Figure 19C:
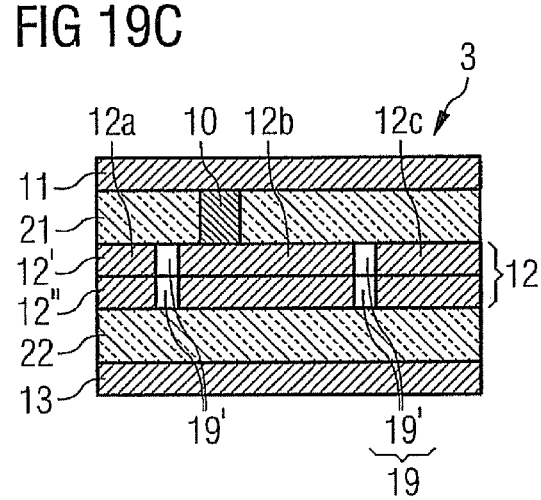
Figure 19D:
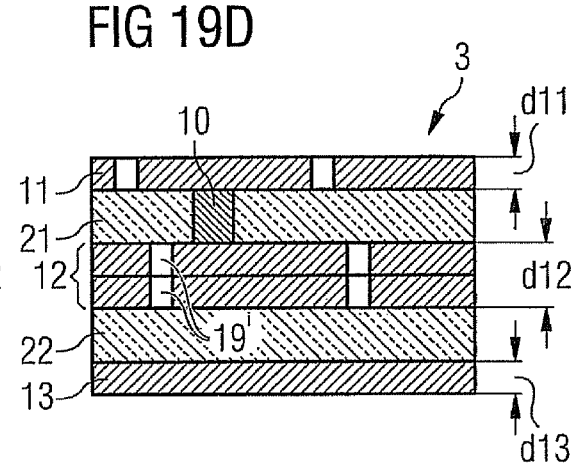

With reference to FIG. 19a two sub-substrates 3', 3" are provided. Each of the sub-substrates 3', 3" may be produced as described above. Each of the bottom metal layer 12' of sub-substrate 3' and the top metal layer 12" of sub-substrate 3" includes a number of grooves 19'. The sub-substrates 3', 3" are stacked and aligned such that the grooves 19' of metal layer 12' and the grooves of metal layer 12" match. Between adjacent sub-substrates 3', 3" additional material, e.g., silver paste or conductive glue, may be arranged to improve the joining properties. Then this stacked arrangement is clamped between clamping jaws 20 (FIG. 19b) such that the sub-substrates 3', 3" are pressed to one another. During clamping the temperature of the stack may be increased. FIG. 19c illustrates the multilayer substrate 3 after releasing the pressure. Adjacent grooves 19' of adjacent metal layers 12', 12" form grooves 19 due to which metal layer 12 which is formed from metal layers 12', 12" is divided into sections 12a, 12b, 12c distant and electrically insulated from one another. Optionally, another grooves 19 may be produced in at least one of the top metal layer 11 and the bottom metal layer 13 (FIG. 19d).

Figure 20A:
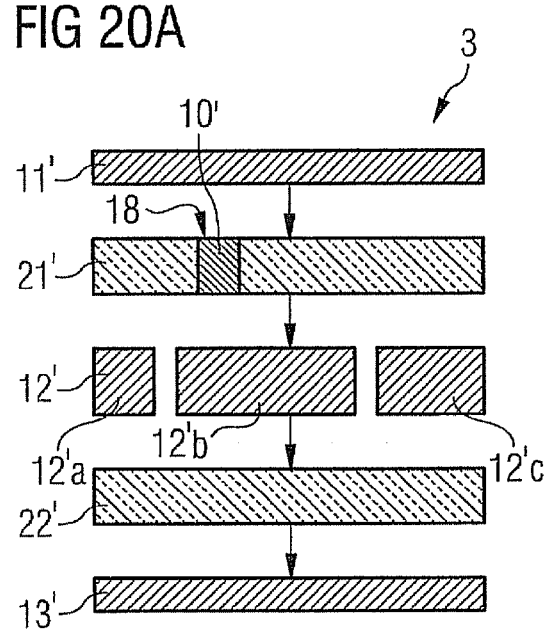
FIGS. 20A-20B illustrate different processes of another procedure for manufacturing a multilayer substrate.
Figure 20B:
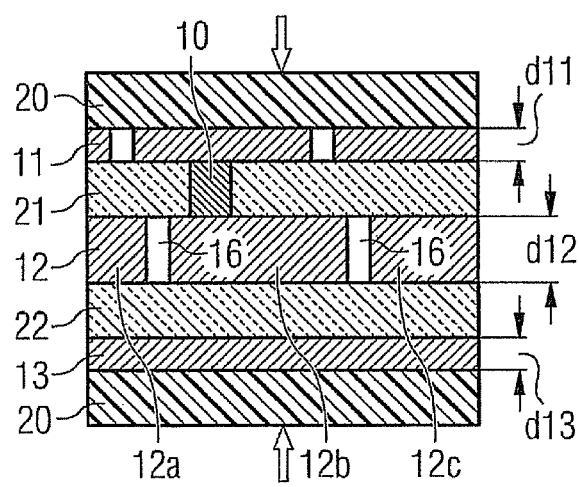

Another embodiment for a method of producing a multilayer substrate 3 is explained with reference to FIG. 20. FIG. 20a illustrates metal layers 11', 12', 13' and ceramic layers 21', 22'. Ceramic layer 21' is provided with an opening 18 which may be filled with conductive material, e.g., silver paste or copper balls. Metal layer 12' includes sections 12'a, 12'b, 12'c which are distant from one another. After adjusting and stacking the metal layers 11', 12', 13' and the ceramic layers 21', 22' the stack is clamped between clamping jaws 20 (FIG. 20b) such that the layers 11', 21', 12', 22', 13' are pressed to one another. During clamping the temperature of the stack may be increased. After releasing the pressure, a multilayer substrate exists which differs from the multilayer substrate 3 of FIG. 19c in that the middle metal layer 12 is made in one piece. Instead of grooves 19 the sections 12a, 12b, 12c of metal layer 12 are spaced apart by spaces 16.

If, e.g., the metal layers 11', 12', 12", 13' include identical thicknesses, the thickness d11 of the top metal layer 11 and the thickness d13 of the bottom metal layer 13 (FIGS. 19d, 20b) of the multilayer substrate 3 is about half the thicknesses d12 of all other metal layers 12 of the multilayer substrate 3.

Figure 21A:
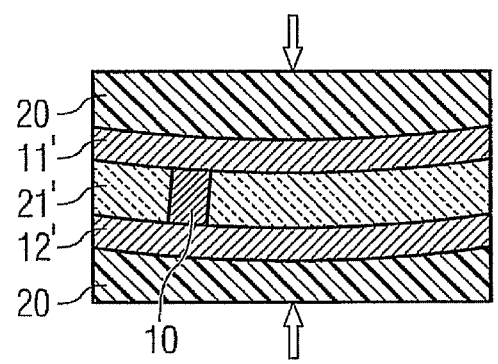
FIGS. 21A-21B illustrate different processes of a procedure for manufacturing a pre-curved multilayer substrate.
Figure 21B:
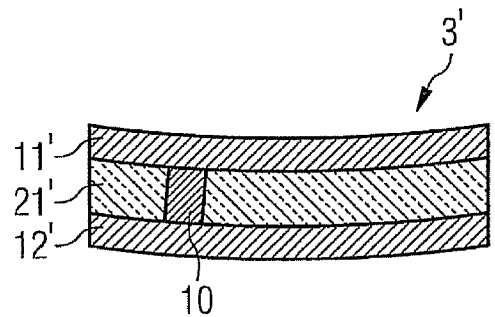

FIG. 21 illustrates different processes of a procedure for manufacturing a pre-curved multilayer substrate. The processes may be identical to the procedures described with reference to FIGS. 19 and 20. However, the pre-curvature may be achieved by using curved clamping jaws 20 (FIG. 21a) instead of plane clamping jaws 20 described with reference to FIG. 18f. FIG. 21b illustrates the pre-curved sub-substrate 3' after releasing the pressure applied by the curved clamping jaws 20. In the same way, pre-curved multilayer substrates may be produced by using curved clamping jaws 20 instead of plane clamping jaws 20 described with reference to FIGS. 19b and 20b.

Figure 22:
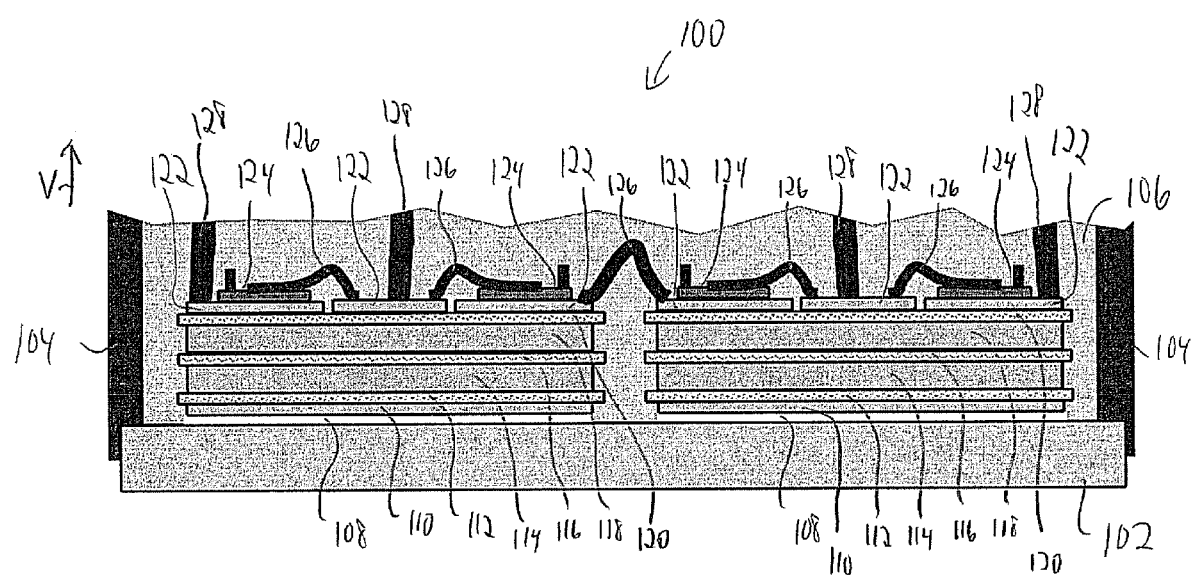
FIG. 22 illustrates a partial vertical cross sectional view of one embodiment a power semiconductor module including multilayer substrates including four metal layers and three ceramic layers for spreading the isolation voltage and the electric field.

FIG. 22 illustrates a partial vertical cross sectional view of one embodiment a power semiconductor module 100 including multilayer substrates including four metal layers and three ceramic layers for spreading the isolation voltage and the electric field. Power semiconductor module 100 includes a base plate 102, a housing 104, potting 106, solder joints or sintered joints 108, metal layers 110, 114, and 118, and 122, ceramic layers 112, 116, and 120, semiconductor chips 124, bonding wires 126, and contacts 128.

Each multilayer substrate includes four metal layers 110, 114, 118, and 122 and three ceramic layers 112, 116, and 120, which are arranged in succession and alternately in a vertical direction v. Each metal layer 110, 114, 118, and 122 includes Cu, Al, Ag, an alloy thereof, or other suitable metal. Each ceramic layer 112, 116, and 120 includes $Al_2O_3$, AlN, $Si_3N_4$, or other suitable insulating material. Between any two of the metal layers 110, 114, 118, and 122, at least one of the ceramic layers 112, 116, and 120 is arranged. In one embodiment, each metal layer 110, 114, 118, and 122 have resistive contacts to the adjacent metal layers for low leakage while providing voltage spreading via a resistive divider. The thicknesses of metal layers 110, 114, 118, and 122 and ceramic layers 112, 116, and 120 are selected to achieve a lower thermal resistance compared to a single ceramic layer substrate. The lower thermal resistance is achieved by having thinner ceramic layers between the metal layers.

The bottom metal layer 110 of each multilayer substrate is bonded to base plate 102 via a solder joint or sintered joint 108. Base plate 102 includes Cu, MMC, Al, an Al alloy, or other suitable metal. In one embodiment, base plate 102 has a thickness between 0.5 mm and 20 mm. Housing 104 is joined to base plate 102 and encloses potting 106. Housing 104 is made of plastic or another suitable material. In one embodiment, potting 106 is a soft potting (e.g., silicone gel) or other suitable insulating resin or mould having a low electrical conductivity. The edges of each multilayer substrate including metal layers 110, 114, 118, and 122 and ceramic layers 112, 116, and 120 are completely encased in potting and the potting is void free. In one embodiment, the potting is carried out in a vacuum at less than 100 mbar, such as at 50 mbar or 20 mbar.

Top metal layer 122 is structured to form conductive lines and/or conductive areas. Power semiconductor chips 124 are directly joined and/or electrically connected to top metal layer 122 via a bonding layer (e.g., soft solder, diffusion solder, a conductive adhesive, or a silver including layer that is the result of a low temperature joining technique (LTJT)). The power semiconductor chips include, for example, controllable power semiconductors such as MOSFETs, IGBTs, JFETs, thyristors, or power diodes.

The upper sides of power semiconductor chips 124 are electrically coupled to one another and/or to top metal layer 122 via bonding wires 126. Bonding wires 126 include, for example, wires made of aluminum or an aluminum alloy (e.g., an aluminum-magnesium alloy) or wires made of copper or a copper alloy. Bonding wires 126 are bonded, for example, by ultrasonic bonding. In another embodiment, bonding wires 126 are replaced with metal clips that are joined by a low temperature joining technique (LTJT). Contacts 128 are electrically coupled to top metal layer 122. Contacts 128 electrically couple power semiconductor module 100 to a power supply, a load, and/or a control unit, etc.

In one embodiment, two, three, or more single layered substrates are stacked to provide the multilayered substrate. Stacking is accomplished during the assembly process, which is used for a single layered substrate (i.e., soldering to base plate, sintering to base plate, gluing to base plate, clamping to base plate). The stacked substrates are joined in the same way as the base plate to the substrate and optionally during the same single joining process. In another embodiment, stacked substrates are joined in a separate process by silver sintering (e.g., NTV, LTJT), transient liquid phase soldering (TLP), gluing, or other suitable process. In another embodiment, the multilayer substrate is manufactured using a DCB, AMB, or DAB manufacturing process.

In this embodiment, the edges of metal layers 110, 114, 118, and 122 are aligned and the two inner metal layers 114 and 118 are thicker than the bottom metal layer 110 and the top metal layer 122. In one embodiment, the two inner metal layers 114 and 118 are twice as thick as the bottom metal layer 110 and the top metal layer 122. The multilayer substrate spreads the isolation voltage and the electric field over the layers at the edges and corners of the substrate.

For a substrate with a single ceramic layer having a thickness of 0.63 mm, the maximum electric field at the edges of the substrate is around $8.8*10^8$ V/m for an applied total voltage of 10 kV. In this case, the maximum electric field is located at the edge of the top metal layer. In contrast, for a multilayer substrate including two ceramic layers, the maximum electric field at the edge of the top metal layer is reduced to around $4.35*10^8$ V/m or less, as long as the inner metal layers' edges have a greater distance to the edge of the ceramic layers than the top metal layer and the bottom metal layer. In this case, however, the inner metal layer has a higher electric field maximum. This reduction in the maximum electric field is achieved with the total ceramic thickness remaining constant (i.e., the multilayer substrate with two ceramic layers has ceramic layers of one half the thickness—0.32 mm in this example—of the single ceramic layer of a single ceramic layer substrate).

In the embodiment illustrated in FIG. 22 including a multilayer substrate with three ceramic layers, a further reduction in the electric field is achieved. In this embodiment, the thickness of each of the three ceramic layers is one third the thickness of the single ceramic layer of a single ceramic layer substrate. Likewise, a multilayer substrate with four ceramic layers provides a further reduction in the electric field, where the thickness of each of the four ceramic layers is one fourth the thickness of the single ceramic layer of a single ceramic layer substrate. In other embodiments, more than four ceramic layers are used. For example, instead of a 1 mm thick single ceramic layer typically used in a single ceramic layer substrate, two 0.5 mm thick ceramic layers, three 0.32 mm thick ceramic layers, or four 0.25 mm thick ceramic layers are used in the multilayer substrate.

The stacked multilayer substrate splits the isolation voltage by capacitive coupling of metal layers 110, 114, 118, and 122. To achieve good voltage sharing between metal layers 110, 114, 118, and 122, in one embodiment, the areas of each metal layer 110, 114, 118, and 122 are similar, such as within 10%. If the thicknesses of ceramic layers 112, 116, and/or 120 vary, the voltage sharing may be adjusted by adjusting the area of metal layers 110, 114, 118, and/or 122. The material used for each ceramic layer 112, 116, and 120 may also vary from each other to provide the optimum compromise for both thermal impedance and voltage sharing.

In one embodiment, the multilayer substrate provides isolation voltages greater than 4 kVrms and prevents partial discharges for voltages above 2 kVrms. In one embodiment, the multilayer substrate reduces the maximum electric field at the edge of the substrate to below 70% of the maximum electric field exhibited at the edge of a substrate having a single ceramic layer of same total thickness.

Figure 23:
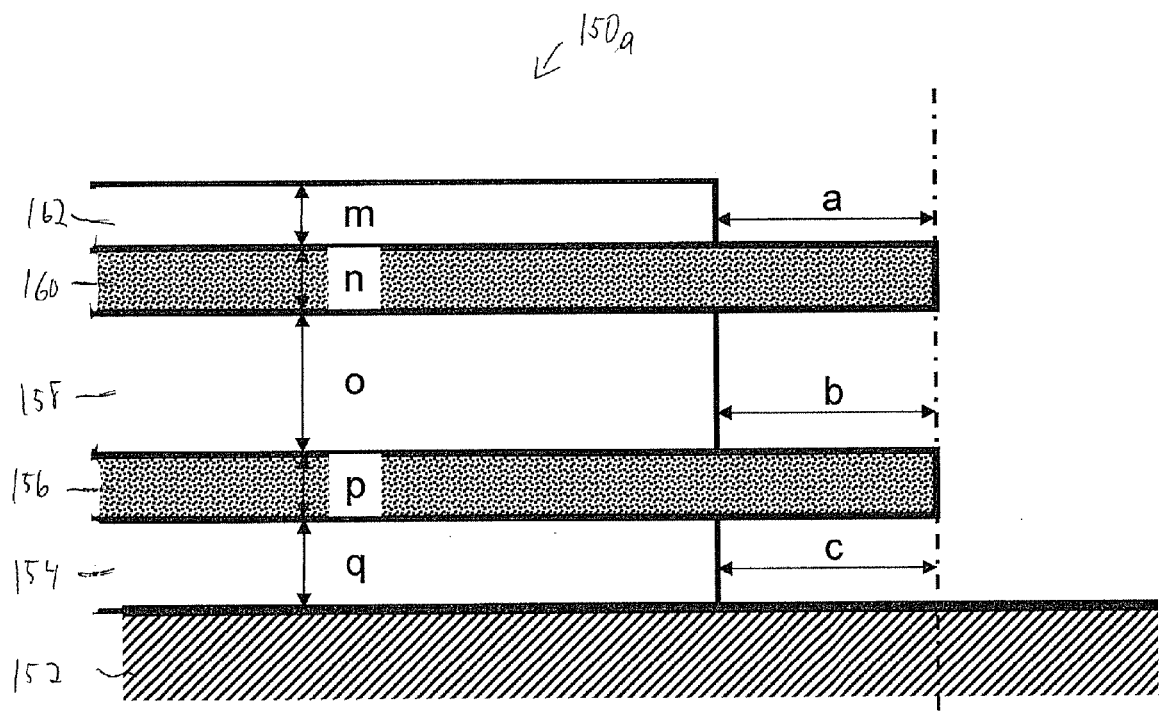
FIG. 23 illustrates a vertical cross sectional view of one embodiment of a multilayer substrate including three metal layers and two ceramic layers for spreading the isolation voltage and the electric field.

FIG. 23 illustrates a vertical cross sectional view of one embodiment of a multilayer substrate 150a including three metal layers and two ceramic layers for spreading the isolation voltage and the electric field. Multilayer substrate 150a is bonded to a base plate 152 and includes metal layers 154, 158, and 162 and ceramic layers 156 and 160. In this embodiment, the edges of metal layers 154, 158, and 162 are aligned and the edges of ceramic layers 156 and 160 are aligned. The edges of ceramic layers 156 and 160 extend beyond the edges of metal layers 154, 158, and 162.

Bottom metal layer 154 has a thickness indicated by q and an edge at a distance from the edge of ceramic layer 156 indicated by c. In one embodiment, the thickness indicated by q includes the joining layer that bonds metal layer 154 to base plate 152. The joining layer provides up to 0.2 mm of the thickness indicated by q for a solder joint or up to 30 µm of the thickness indicated by q for a sintered joint. In one embodiment, the thickness of bottom metal layer 154 is selected to compensate for the asymmetric voltage plane generated by base plate 152.

Ceramic layer 156 has a thickness indicated by p. Inner metal layer 158 has a thickness indicated by o and an edge at a distance from the edge of ceramic layer 156 indicated by b. Ceramic layer 160 has a thickness indicated by n. Top metal layer 162 has a thickness indicated by m and an edge at a distance from the edge of ceramic layer 156 indicated by a.

In one embodiment, for a power semiconductor module having a 3.3 kV blocking voltage: n, p=0.32 mm; m=0.3 mm; o=0.6 mm; q=0.4 mm; and a, b, c,=1 mm. In another embodiment, for a power semiconductor module having a 3.3 kV blocking voltage: n, p=0.32 mm; m=0.6 mm; o=1.2 mm;

q=0.8 mm; and a, b, c,=1 mm. In another embodiment, for a power semiconductor module having a 6.5 kV blocking voltage: n, p=0.5 mm; m=0.3 mm; o=0.6 mm; q=0.4 mm; and a, b, c,=1 mm. In another embodiment, for a power semiconductor module having a 6.5 kV blocking voltage: n, p=0.63 mm; m=0.3 mm; o=0.6 mm; q=0.4 mm; and a, b, c,=1 mm. In another embodiment, for a power semiconductor module having a 6.5 kV blocking voltage: n, p=0.5 mm; m=0.6 mm; o=1.2 mm; q=0.8 mm; and a, b, c,=1 mm. In other embodiments, other suitable values are used for a, b, c, m, n, o, p, and q.

Figure 24:
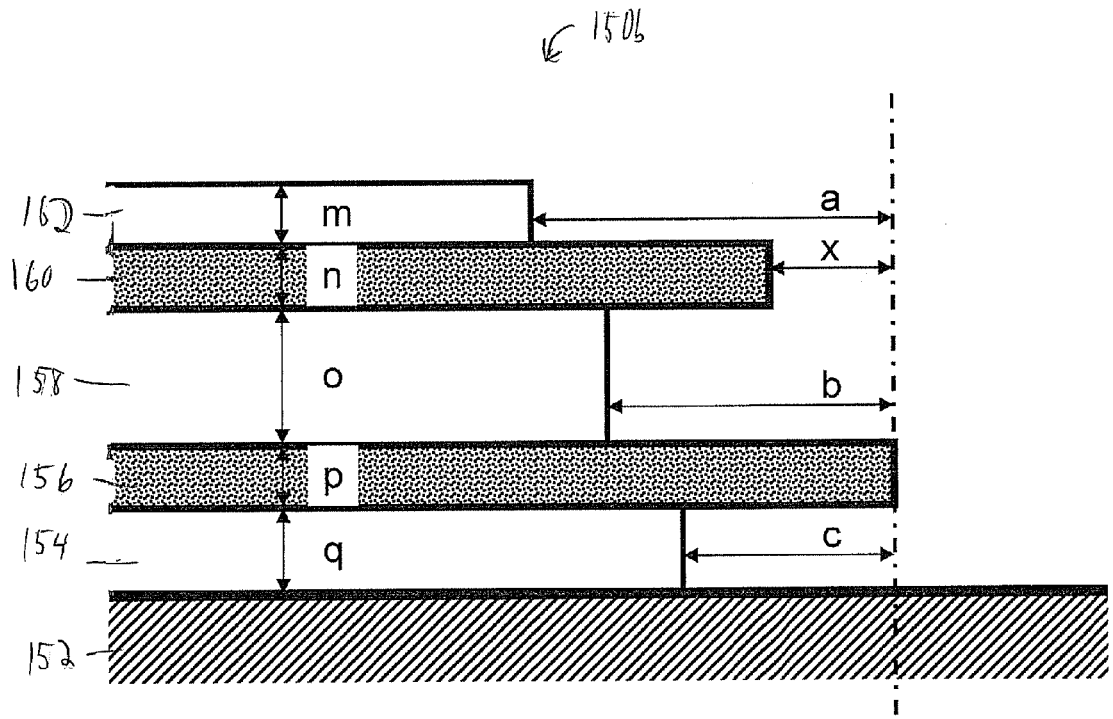
FIG. 24 illustrates a vertical cross sectional view of another embodiment of a multilayer substrate including three metal layers and two ceramic layers for spreading the isolation voltage and the electric field.

FIG. 24 illustrates a vertical cross sectional view of another embodiment of a multilayer substrate 150b including three metal layers and two ceramic layers for spreading the isolation voltage and the electric field. Multilayer substrate 150b is bonded to base plate 152 and includes metal layers 154, 158, and 162 and ceramic layers 156 and 160. In this embodiment, the edges of metal layers 154, 158, and 162 are not aligned and the edges of ceramic layers 156 and 160 are not aligned. The edges of ceramic layers 156 and 160 extend beyond the edges of metal layers 154, 158, and 162.

The thicknesses indicated by q, p, o, n, and m and the distances indicated by c, b, and a are defined as previously described and illustrated with reference to FIG. 23. In addition, the edge of top ceramic layer 160 is at a distance from the edge of ceramic layer 156 indicated by x. In this embodiment, the distance between the edge of each metal layer 154, 158, and 162 and the edge of ceramic layer 156 increases for each metal layer 154, 158, and 162 from bottom metal layer 154 to top metal layer 162. Therefore, a>b and b>c. In one embodiment: c=1 mm, b=1.5 mm; a=2 mm; and x=0.5 mm. In other embodiments, other suitable values are used for a, b, c, and x. This structure results in some high electric field maxima but reduces the electric fields at the undersides of ceramic layers 156 and 160. As such, this structure is less sensitive to voids in potting at the undersides of ceramic layers 156 and 160.

Figure 25:
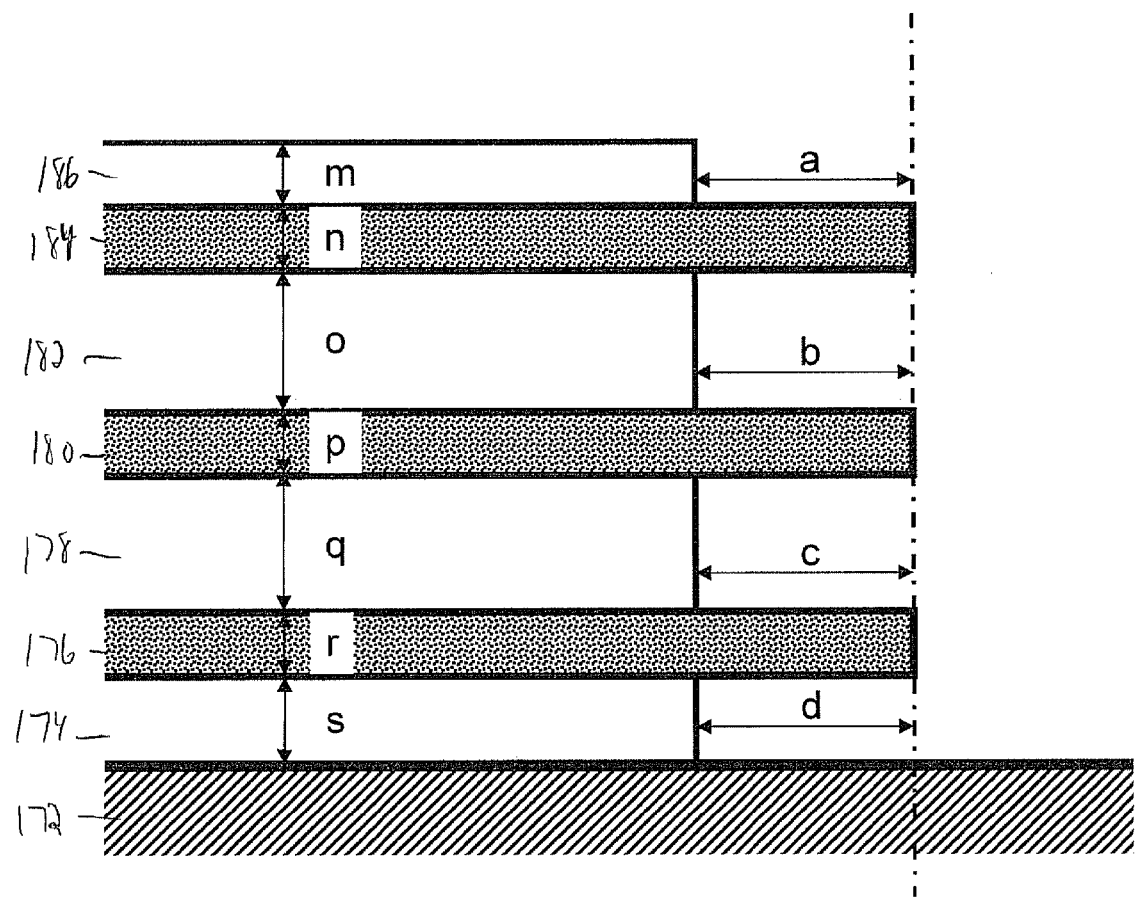
FIG. 25 illustrates a vertical cross sectional view of one embodiment of a multilayer substrate including four metal layers and three ceramic layers for spreading the isolation voltage and the electric field.

FIG. 25 illustrates a vertical cross sectional view of one embodiment of a multilayer substrate 170 including four metal layers and three ceramic layers for spreading the isolation voltage and the electric field. Multilayer substrate 170 is bonded to a base plate 172 and includes metal layers 174, 178, 182, and 186 and ceramic layers 176, 180, and 184. In this embodiment, the edges of metal layers 174, 178, 182, and 186 are aligned and the edges of ceramic layers 176, 180, and 184 are aligned. The edges of ceramic layers 176, 180, and 184 extend beyond the edges of metal layers 174, 178, 182, and 186.

Bottom metal layer 174 has a thickness indicated by s and an edge at a distance from the edge of ceramic layer 176 indicated by d. In one embodiment, the thickness indicated by s includes the joining layer that bonds metal layer 174 to base plate 172. The joining layer provides up to 0.2 mm of the thickness indicated by s for a solder joint or up to 30 μm of the thickness indicated by s for a sintered joint. In one embodiment, the thickness of bottom metal layer 174 is selected to compensate for the asymmetric voltage plane generated by base plate 172.

Ceramic layer 176 has a thickness indicated by r. Inner metal layer 178 has a thickness indicated by q and an edge at a distance from the edge of ceramic layer 176 indicated by c. Ceramic layer 180 has a thickness indicated by p. Inner metal layer 182 has a thickness indicated by o and an edge at a distance from the edge of ceramic layer 176 indicated by b. Ceramic layer 184 has a thickness indicated by n. Top metal layer 186 has a thickness indicated by m and an edge at a distance from the edge of ceramic layer 176 indicated by a.

In one embodiment, for a power semiconductor module having a 3.3 kV blocking voltage: n, p, r=0.25 mm; m=0.3 mm; o=0.6 mm; q=0.6 mm; s=0.4 mm; and a, b, c, d=1 mm. In another embodiment, for a power semiconductor module having a 3.3 kV blocking voltage: n, p, r=0.25 mm; m=0.6 mm; o=1.2 mm; q=1.2 mm; s=0.8 mm; and a, b, c, d=1 mm. In another embodiment, for a power semiconductor module having a 6.5 kV blocking voltage: n, p, r=0.32 mm; m=0.3 mm; o=0.6 mm; q=0.6 mm; s=0.4 mm; and a, b, c, d=1 mm. In another embodiment, for a power semiconductor module having a 6.5 kV blocking voltage: n, p, r=0.32 mm; m=0.6 mm; o=1.2 mm; q=1.2 mm; s=0.8 mm; and a, b, c, d=1 mm. In another embodiment, for a power semiconductor module having a 6.5 kV blocking voltage: n, p, r=0.5 mm; m=0.6 mm; o=1.2 mm; q=1.2 mm; s=0.8 mm; and a, b, c, d=1 mm. In other embodiments, other suitable values are used for a, b, c, d, m, n, o, p, q, r, and s.

Figure 26:
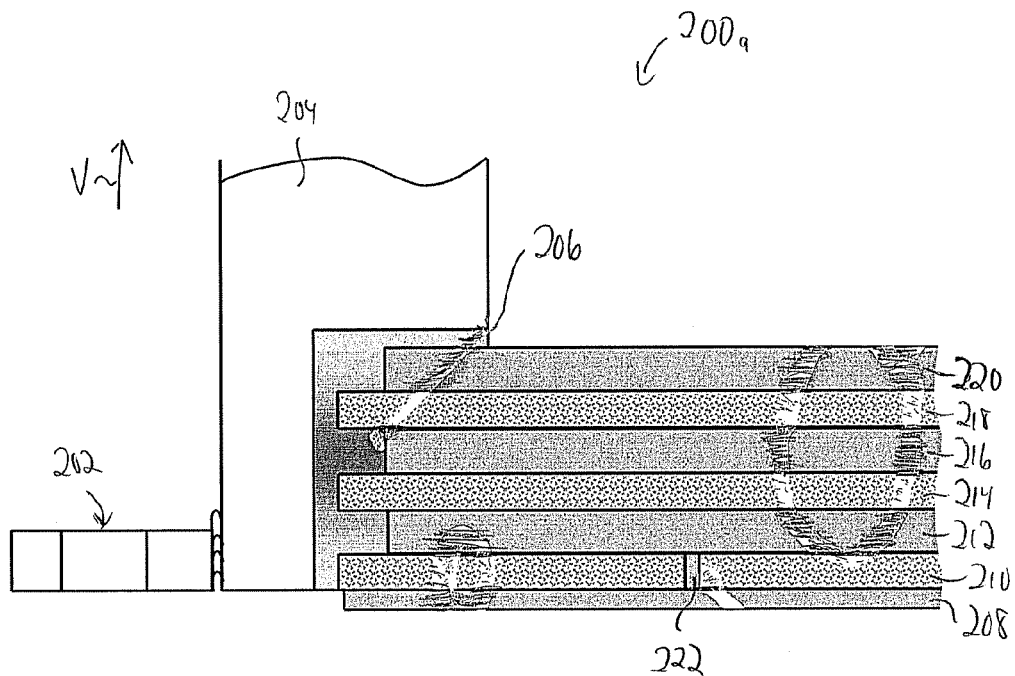
FIG. 26 illustrates a vertical cross sectional view of one embodiment of an edge area of a power semiconductor module, wherein a ceramic layer of the multilayer substrate includes a via that electrically connects the metal layers that are arranged on opposite sides of the ceramic layer.

FIG. 26 illustrates a vertical cross sectional view of one embodiment of an edge area of a power semiconductor module 200a, wherein a ceramic layer of the multilayer substrate includes a via that electrically connects the metal layers that are arranged on opposite sides of the ceramic layer. Power semiconductor module 200a includes a mounting area 202 including a screw hole, a housing 204, filler 206, metal layers 208, 212, 216, and 220, and ceramic layers 210, 214, and 218. Filler 206 fills the gap between housing 204 and the multilayer substrate. A via 222 through ceramic layer 210 electrically shorts metal layer 212 to metal layer 208.

The multilayer substrate includes four metal layers 208, 212, 216, and 220 and three ceramic layers 210, 214, and 218, which are arranged in the vertical direction v. In other embodiments, the multilayer substrate may include additional metal layers and/or additional ceramic layers. In this embodiment, metal layer 208 is used in place of a base plate. Upper metal layers 212, 216, and 220, and upper ceramic layers 214 and 218 provide a multilayer insulating substrate for spreading the isolation voltage and electric field between the layers as previously described. The short between metal layer 208 and 212 reduces the electric field at the exposed outer edges of metal layer 208 in a similar manner as previously described and illustrated with reference to FIG. 3. In one embodiment, the dimensions of metal layers 212, 216, and 220 and ceramic layers 214 and 218 are defined as previously described and illustrated with reference to multilayer substrate 150a of FIG. 23 or multilayer substrate 150b of FIG. 24.

Figure 27:
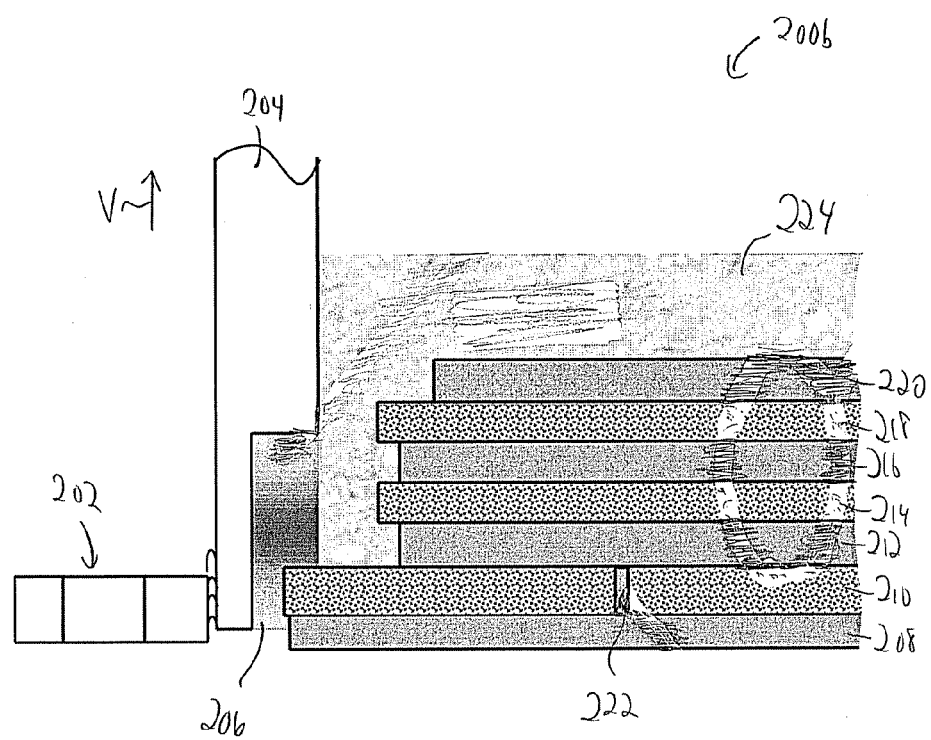
FIG. 27 illustrates a vertical cross sectional view of another embodiment of an edge area of a power semiconductor module, wherein a ceramic layer of the multilayer substrate includes a via that electrically connects the metal layers that are arranged on opposite sides of the ceramic layer.

FIG. 27 illustrates a vertical cross sectional view of another embodiment of an edge area of a power semiconductor module 200b, wherein a ceramic layer of the multilayer substrate includes a via that electrically connects the metal layers that are arranged on opposite sides of the ceramic layer. Power semiconductor module 200b includes mounting area 202 including a screw hole, housing 204, filler 206, metal layers 208, 212, 216, and 220, ceramic layers 210, 214, and 218, and potting 224. Filler 206 fills the gap between housing 204 and ceramic layer 210. In this embodiment, potting material 224 surrounds metal layers 212, 216, and 220 and ceramic layers 214 and 218. A via 222 through ceramic layer 210 electrically shorts metal layer 212 to metal layer 208.

As in power semiconductor module 200a previously described and illustrated with reference to FIG. 26, upper metal layers 212, 216, and 220 and upper ceramic layers 214 and 218 of semiconductor module 200b provide a multilayer insulating substrate. The multilayer insulating substrate spreads the isolation voltage and electric field between the layers as previously described. The short between metal layer 208 and 212 reduces the electric field at the exposed outer edges of metal layer 208 in a similar manner as previously described and illustrated with reference to FIG. 3. In one embodiment, the dimensions of metal layers 212, 216, and 220 and ceramic layers 214 and 218 are defined as previously described and illustrated with reference to multilayer substrate 150a of FIG. 23 or multilayer substrate 150b of FIG. 24.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module comprising:
a multilayer substrate comprising:
a first metal layer;
a first ceramic layer over the first metal layer, an edge of the first ceramic layer extending beyond an edge of the first metal layer;
a second metal layer over the first ceramic layer;
a second ceramic layer over the second metal layer, an edge of the second ceramic layer extending beyond an edge of the second metal layer; and
a third metal layer over the second ceramic layer,
wherein the multilayer substrate is configured to provide an isolation voltage greater than 4 kVrms.

2. The semiconductor module of claim 1, wherein the edges of the first metal layer, the first ceramic layer, the second metal layer, the second ceramic layer, and the third metal layer are encased in potting.

3. The semiconductor module of claim 1, wherein the edges of the first metal layer, the second metal layer, and the third metal layer are aligned.

4. The semiconductor module of claim 1, wherein the edges of the first ceramic layer and the second ceramic layer are aligned.

5. The semiconductor module of claim 1, wherein a thickness of the first ceramic layer is substantially equal to a thickness of the second ceramic layer.

6. The semiconductor module of claim 1, wherein a thickness of the second metal layer is greater than a thickness of the first metal layer and greater than a thickness of the third metal layer.

7. The semiconductor module of claim 1, wherein the edge of the first ceramic layer extends beyond the edge of the second ceramic layer, and
wherein the edge of the first ceramic layer is located at an outer surface of the multilayer substrate, and
wherein the edge of the second ceramic layer is located at an outer surface of the multilayer substrate.

8. The semiconductor module of claim 1, wherein the edge of the first metal layer extends beyond the edge of the second metal layer, and
wherein the edge of the second metal layer extends beyond an edge of the third metal layer.

9. The semiconductor module of claim 1, wherein the first ceramic layer is 0.5 mm thick, and
wherein the second ceramic layer is 0.5 mm thick.

10. The semiconductor module of claim 1, wherein the multilayer substrate further comprises:
a third ceramic layer over the third metal layer, an edge of the third ceramic layer extending beyond an edge of the third metal layer; and
a fourth metal layer over the third ceramic layer.

11. The semiconductor module of claim 10, wherein the first ceramic layer comprises a via electrically shorting the first metal layer to the second metal layer.

12. The semiconductor module of claim 10, wherein the first ceramic layer is 0.32 mm thick,
wherein the second ceramic layer is 0.32 mm thick, and
wherein the third ceramic layer is 0.32 mm thick.

13. A power semiconductor module comprising:
a multilayer substrate comprising at least two insulating layers, each insulating layer disposed between metal layers, the multilayer substrate configured to provide an isolation voltage greater than 4 kVrms; and
potting material encasing the multilayer substrate,
wherein the multilayer substrate and the potting material are configured to prevent partial discharges at voltages greater than 2 kVrms.

14. The power semiconductor module of claim 13, wherein the multilayer substrate is configured such that a maximum electric field at an edge of the multilayer substrate is less than 70% of a maximum electric field at an edge of a substrate having a single insulating layer of the same total thickness as the at least two insulating layers.

15. The power semiconductor module of claim 13, wherein an edge of each of the at least two insulating layers extends beyond an edge of each of the metal layers.

16. The power semiconductor module of claim 13, wherein the area of each metal layer is within 10% of the area of each other metal layer.

17. The power semiconductor module of claim 13, further comprising:
a base plate joined to a first side of the multilayer substrate; and
a power semiconductor chip joined to a second side of the multilayer substrate, the second side opposite the first side.

18. A method for fabricating the semiconductor module of claim 13, the method comprising:
providing a first metal layer;
bonding a first ceramic layer to the first metal layer, an edge of the first ceramic layer extending beyond an edge of the first metal layer;
bonding a second metal layer to the first ceramic layer;
bonding a second ceramic layer to the second metal layer, an edge of the second ceramic layer extending beyond an edge of the second metal layer; and
bonding a third metal layer to the second ceramic layer.

19. The method of claim 18, further comprising:
encasing the edges of the first metal layer, the first ceramic layer, the second metal layer, the second ceramic layer, and the third metal layer in potting.

20. The method of claim 18, further comprising:
bonding the first metal layer to a base plate.

21. The method of claim 18, further comprising:
bonding a third ceramic layer to the third metal layer, an edge of the third ceramic layer extending beyond an edge of the third metal layer; and
bonding a fourth metal layer to the third ceramic layer.

22. The method of claim 21, further comprising:
electrically shorting the first metal layer to the second metal layer through a via in the first ceramic layer.

* * * * *